(12) United States Patent  (10) Patent No.: US 12,297,703 B2
Ma et al.  (45) Date of Patent: May 13, 2025

(54) SYSTEM FOR OPTIMIZING PARTICLE SIZE DISTRIBUTION OF LOST CIRCULATION MATERIALS

(71) Applicant: SOUTHWEST PETROLEUM UNIVERSITY, Sichuan (CN)

(72) Inventors: Tianshou Ma, Chengdu (CN); Yang Liu, Chengdu (CN); Sitong Chen, Chengdu (CN); Pei Zhang, Chengdu (CN); Lei Gao, Chengdu (CN); Xingyun Xiang, Chengdu (CN); Yezhong Wang, Chengdu (CN)

(73) Assignee: SOUTHWEST PETROLEUM UNIVERSITY, Chengdu (CN)

( * ) Notice: Subject to any disclaimer, the term of this patent is extended or adjusted under 35 U.S.C. 154(b) by 0 days.

(21) Appl. No.: 18/895,379

(22) Filed: Sep. 24, 2024

(65) Prior Publication Data

US 2025/0101819 A1 Mar. 27, 2025

(30) Foreign Application Priority Data

Sep. 26, 2023 (CN) .......................... 202311247056.2

(51) Int. Cl.
*E21B 43/26* (2006.01)
*E21B 21/00* (2006.01)
(Continued)

(52) U.S. Cl.
CPC .......... *E21B 21/003* (2013.01); *E21B 33/138* (2013.01); *E21B 43/261* (2013.01); *G06F 30/25* (2020.01)

(58) Field of Classification Search
CPC ..... E21B 33/138; E21B 43/261; E21B 21/003
(Continued)

(56) References Cited

U.S. PATENT DOCUMENTS 9,765,596 B2 * 9/2017 Savari ........................ E21B 7/00
10,035,941 B2 * 7/2018 Whitfill .................. C09K 8/035
(Continued)

FOREIGN PATENT DOCUMENTS

CN 110147644 A 8/2019
CN 110878200 A 3/2020
(Continued)

OTHER PUBLICATIONS

First Office Action in Chinese Application No. 202311247056.2 mailed on Feb. 22, 2024, 12 pages.
(Continued)

*Primary Examiner* — William D Hutton, Jr.
*Assistant Examiner* — Ashish K Varma
(74) *Attorney, Agent, or Firm* — PORUS IP LLC

(57) ABSTRACT

Disclosed is a system for optimizing a particle size distribution of a lost circulation material. The system comprises a data acquisition module, a communication module, an experimental module, a particle size distribution optimization module, and a plugging and filling module. The data acquisition module is configured to obtain a target feature particle size. The experimental module is configured to obtain the target feature particle size, and set a plurality of experimental schemes for fracture plugging; conduct fracture plugging experiments to obtain experimental results; evaluate a plurality of fracture plugging effects of each of the plurality of experimental schemes. The particle size distribution optimization module is configured to obtain the plurality of fracture plugging effects, determine a particle size distribution rule, and obtain optimized particle size distribution data by optimizing the particle size distribution of the lost circulation material. The plugging and filling module is configured to perform a plugging operation.

8 Claims, 12 Drawing Sheets

(51) Int. Cl.
  *E21B 33/138* (2006.01)
  *G06F 30/25* (2020.01)
(58) Field of Classification Search
  USPC .......................................................... 175/72
  See application file for complete search history.

(56) References Cited

U.S. PATENT DOCUMENTS

| | | | | |
|---|---|---|---|---|
| 11,359,125 | B2* | 6/2022 | Al-Yami | C09K 8/516 |
| 11,434,410 | B2* | 9/2022 | Lewis | C09K 8/467 |
| 2006/0096759 | A1* | 5/2006 | Reddy | C09K 8/516 |
| | | | | 166/295 |

FOREIGN PATENT DOCUMENTS

| | | |
|---|---|---|
| CN | 111303842 A | 6/2020 |
| CN | 111539101 A | 8/2020 |
| CN | 114414739 A | 4/2022 |
| CN | 114621738 A | 6/2022 |
| CN | 115544880 A | 12/2022 |
| CN | 116451612 A | 7/2023 |
| CN | 116562189 A | 8/2023 |

OTHER PUBLICATIONS

Notification to Grant Patent Right for Invention in Chinese Application No. 202311247056.2 mailed on Mar. 5, 2024, 2 pages.

Wang, Qiang et al., An Experimental Investigation on Pressure Bearing and Tight Plugging of Fractured Formations in Deep and Ultra-deep Wells, Journal of Southwest Petroleum University (Science & Technology Edition), 43(4): 109-117, 2021.

Zhang, Wei et al., Study on reasonable particle size matching of plugging materials for plugging cracks, Journal of Yangtze University (Nat Sci Edi) Sci & Eng, 9(5): 102-104, 2012.

* cited by examiner

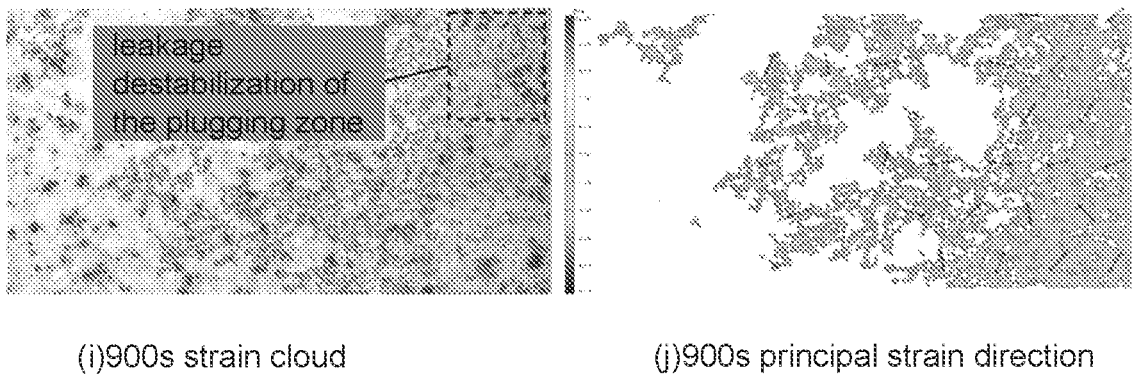

(i) 900s strain cloud  (j) 900s principal strain direction

Determining a data validity based on an experimental image, pressure detection data, and drilling fluid flow data — 1810

In response to determining that the data validity does not satisfy a preset condition, restarting a plurality of fracture plugging experiments to obtain experimental results — 1820

In response to determining that the data validity satisfies the preset condition, predicting, based on a first parameter corresponding to each of the plurality of experimental schemes, the pressure detection data, and the drilling fluid flow data, a fracture sealing effect in a future time period corresponding to each of the plurality of experimental schemes — 1830

FIG. 18

SYSTEM FOR OPTIMIZING PARTICLE SIZE DISTRIBUTION OF LOST CIRCULATION MATERIALS

CROSS-REFERENCE TO RELATED APPLICATION

This application claims priority to Chinese Application No. 202311247056.2, filed on Sep. 26, 2023, the entire contents of which are incorporated herein by reference.

TECHNICAL FIELD

The present disclosure relates to the field of oil and gas drilling, and in particular to a system for optimizing particle size distribution of lost circulation materials.

BACKGROUND

Lost circulation is frequent and often causes huge economic loss during drilling in fractured formation. In addition to direct economic loss, the lost circulation can indirectly lead to various drilling problems. After the lost circulation occurs, the backflow of drilling fluid is reduced, affecting the cutting carrying efficiency of the drilling fluid during circulation, and leading to poor borehole cleaning, which ultimately may result in sand bridging and pipe sticking. Serious lost circulation problem may develop into overflow, kicks, and even lead to blowout, wellbore collapse, and other drilling accidents.

The current method of plugging mainly relies on a bridging plugging method. The bridging plugging method forms a dense and stable plugging zone in the fracture through a certain combination of lost circulation materials, which can control the leakage of drilling fluid and improve the pressure bearing capacity of the formation. The key that the lost circulation material can enter the fracture and form the plugging zone is the reasonable particle size distribution of the lost circulation material. However, many current design methods of the particle size distribution only involve pore-type leakage and micron fractures, and are not suitable for millimeter fractures.

Therefore, it is desirable to provide a system for optimizing a particle size distribution of a lost circulation material, which can determine the reasonable particle size distribution of the lost circulation material under the condition of leakage of drilling fluid caused by the millimeter fractures, thereby improving the efficiency and effect of fracture plugging.

SUMMARY

One or more embodiments of the present disclosure provide a system for optimizing a particle size distribution of a lost circulation material. The system may comprise a data acquisition module, a communication module, an experimental module, a particle size distribution optimization module, and a plugging and filling module. The communication module may include a communication network and a gateway. The communication module may be configured to communicate with the data acquisition module, the experimental module, the particle size distribution optimization module, and the plugging and filling module. The data acquisition module may be configured to: obtain a target feature particle size. The target feature particle size may include at least one of a first feature particle size, a second feature particle size, and a third feature particle size. The first feature particle size may be a feature particle size of a plugging particle affecting a particle bridging plugging position. The second feature particle size may be a feature particle size of a plugging particle affecting an inter-particle force and a force between the particle and a fracture wall. The third feature particle size may be a feature particle size of a plugging particle affecting a compactness of a plugging zone. The experimental module may be configured to: obtain the target feature particle size from the data acquisition module through the communication module and set a plurality of experimental schemes for fracture plugging based on the target feature particle size; the plurality of experimental schemes including a particle size of the lost circulation material; and the particle size of the lost circulation material including at least one of a maximum particle size $D_L$, a minimum particle size $D_S$, and the target feature particle size; conduct fracture plugging experiments based on the plurality of experimental schemes under different fracture width conditions to obtain experimental results; and evaluate, based on the experimental results, a plurality of fracture plugging effects of each of the plurality of experimental schemes under different fracture width conditions. The particle size distribution optimization module may be configured to: obtain the plurality of fracture plugging effects from the experimental module through the communication module and determine a particle size distribution rule based on the plurality of fracture plugging effects; the particle size distribution rule including a particle-fracture ratio and/or a particle size distribution coefficient, and the particle size distribution coefficient including a particle size distribution coefficient of a core bridging particle and a particle size distribution coefficient of a secondary bridging particle; and obtain optimized particle size distribution data by optimizing the particle size distribution of the lost circulation material based on the particle size distribution rule. The plugging and filling module may be configured to perform a plugging operation. The plugging and filling module may be deployed beside a drill column and the plugging and filling module may include at least one raw material reservoir of the lost circulation material, at least one pumping device, and a material control device. The at least one raw material reservoir of the lost circulation material may be connected with the drill column through the at least one pumping device. The at least one pumping device may pump the lost circulation material from the at least one raw material reservoir of the lost circulation material to a target location of the drill column based on a pumping parameter. The material control device may be configured to: obtain the optimized particle size distribution data from the particle size distribution optimization module through the communication module; in response to determining that a plugging instruction is obtained through the communication module, periodically update the pumping parameter; and in each cycle, determine the pumping parameter of the at least one pumping device in a current cycle based on at least one of the optimized particle size distribution data, the pumping parameter of a previous cycle, and current plugging time, and send the pumping parameter to the at least one pumping device to control the at least one pumping device to perform a pumping operation based on the pumping parameter.

BRIEF DESCRIPTION OF THE DRAWINGS

The present disclosure will be further illustrated by way of exemplary embodiments, which will be described in detail by means of the accompanying drawings. These embodiments are not limiting, and in these embodiments, the same numbering indicates the same structure, wherein:

FIG. 18 is a flowchart illustrating an exemplary predicted fracture plugging effect according to some embodiments of the present disclosure.

DETAILED DESCRIPTION

In order to more clearly illustrate the technical solutions of the embodiments of the present disclosure, the accompanying drawings required to be used in the description of the embodiments are briefly described below. The accompanying drawings do not represent the entirety of the embodiments.

It should be understood that the terms "system", "device", "unit" and/or "module" used herein are a way to distinguish between different components, elements, parts, sections, or assemblies at different levels. However, the terms may be replaced by other expressions if other words accomplish the same purpose.

As shown in the present disclosure and in the claims, unless the context clearly suggests an exception, the words "one", "a", "an", "one kind", and/or "the" do not refer specifically to the singular, but may also include the plural. Generally, the terms "including" and "comprising" suggest only the inclusion of clearly identified steps and elements, however, the steps and elements that do not constitute an exclusive list, and the method or apparatus may also include other steps or elements.

When the operations performed in the embodiments of the present disclosure are described in terms of steps, the order of the steps are all interchangeable if not otherwise indicated, the steps are omittable, and other steps may be included in the course of the operations.

Figure 1:
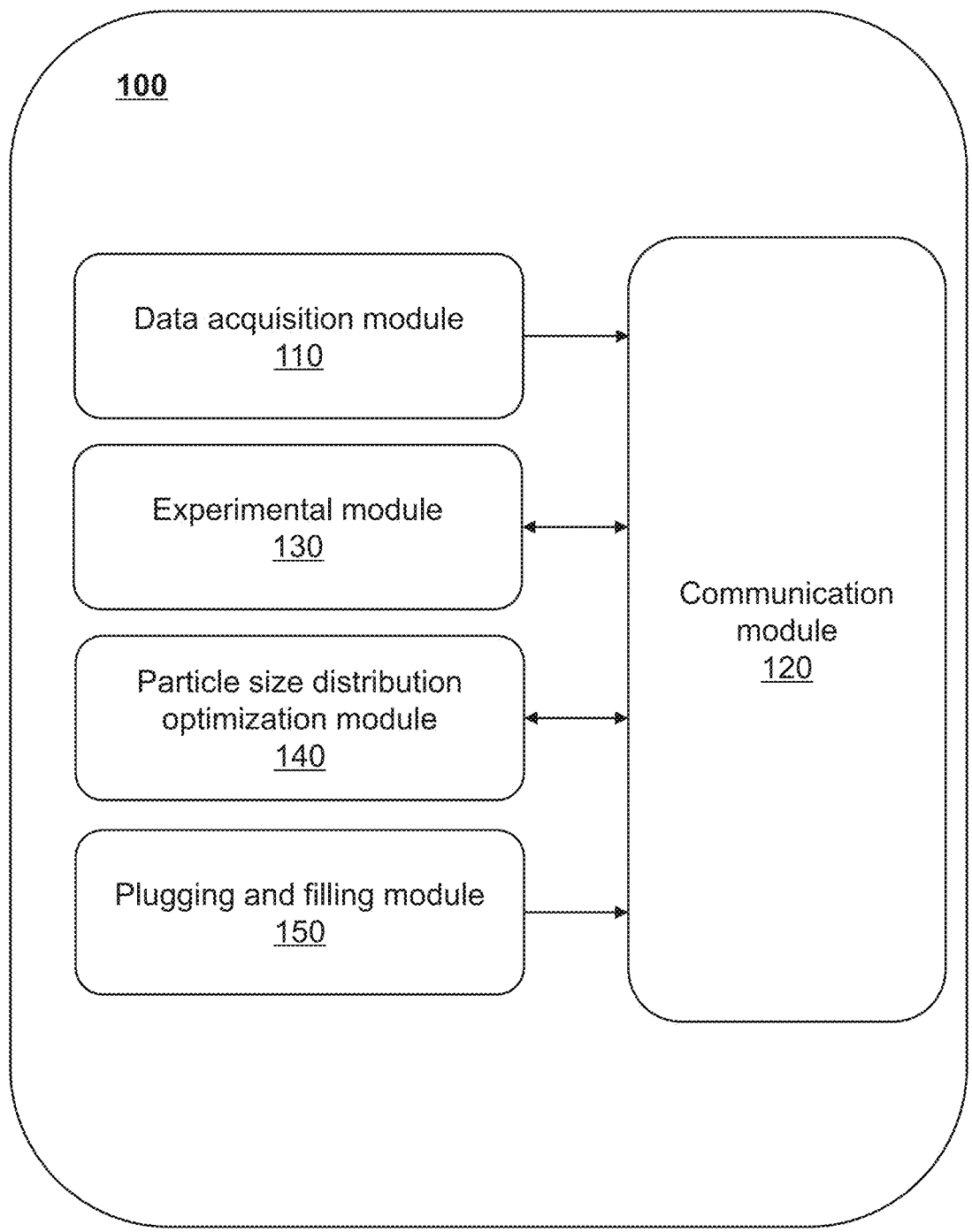
FIG. 1 is a block diagram illustrating an exemplary system for optimizing a particle size distribution of a lost circulation material according to some embodiments of the present disclosure.

FIG. 1 is a block diagram illustrating an exemplary system for optimizing a particle size distribution of a lost circulation material according to some embodiments of the present disclosure.

In some embodiments, a system 100 for optimizing a particle size distribution of a lost circulation material (hereinafter referred to as an optimization system 100) may include a data acquisition module 110, a communication module 120, an experimental module 130, a particle size distribution optimization module 140, and a plugging and filling module 150. The lost circulation material may include a plurality of plugging particles of different particle sizes.

The communication module 120 may be configured to communicate with the data acquisition module, the experimental module, the particle size distribution optimization module, and the plugging and filling module. In some embodiments, the communication module 120 may include a communication network and a gateway. The communication module 120 may perform data transmission or communication via the communication network and perform interaction with the data acquisition module 110, the experimental module 130, the particle size distribution optimization module 140, and the plugging and filling module 150 via the gateway.

The data acquisition module 110 may be configured to obtain a target feature particle size.

The target feature particle size refers to a particle size of a plugging particle used for fracture plugging. In some embodiments, the target feature particle size may include at least one of a first feature particle size, a second feature particle size, and a third feature particle size.

The first feature particle size refers to a feature particle size of a plugging particle affecting a particle bridging plugging position.

The second feature particle size refers to a feature particle size of a plugging particle affecting an inter-particle force and a force between the particle and a fracture wall.

The third feature particle size refers to a feature particle size of a plugging particle affecting a compactness of a plugging zone. The plugging zone refers to a material layer for plugging a fracture constructed from the plugging particles.

In some embodiments, the target feature particle size may be preset based on historical experience. The data acquisition module may obtain the target feature particle size by user input, or may be preset based on the historical experience, etc.

It is understood that when the lost circulation material is used for plugging a formation fracture, the target feature particle size needs to satisfy the following three requirements to achieve a better fracture plugging effect.

(1) The plugging particles can enter the fracture, and a bridging position is located in a fracture throat channel, i.e., the lost circulation material can realize "throat plugging", or "waist plugging".

(2) After bridging within the fracture, the plugging particles do not cause structural damage due to the hydrodynamic dragging effect of drilling fluid, and can realize stable bridging within the plugging zone.

(3) The plugging particles can seal pores between the plugging particles after bridging, forming a compact plugging zone to block the loss of the drilling fluid into the fracture.

In some embodiments, the first feature particle size may include $D_{90}$, the second feature particle size may include $D_{90}$, $D_{75}$, and $D_{50}$, and the third feature particle size may include $D_{25}$ and $D_{10}$.

$D_{90}$ refers to a feature particle size when a cumulative particular size distribution of the plugging particles reaches 90%. $D_{75}$, $D_{50}$, and $D_{25}$ refer to feature particle sizes when the cumulative particular size distribution of the plugging particles is 75%, 50%, and 25%, respectively. $D_{10}$ refers to a feature particle size when the cumulative particular size distribution of the plugging particles is 10%. The cumulative particular size distribution refers to the percentage of a volume of particles with a particle size smaller than a certain feature particle size in a total volume of plugging particles in a unit volume of air. For example, the feature particle size when the cumulative particular size distribution of the plugging particles is 90% may be a feature particle size when 90% of the plugging particles have particle sizes smaller than the feature particle size.

In some embodiments of the present disclosure, the target feature particle size may include a plurality of feature particle sizes with different cumulative masses, which allows for a more comprehensive particle size distribution of the plugging particles, thereby avoiding missing the optimal particle size distribution.

The experimental module 130 may be configured to obtain the target feature particle size from the data acquisition module via the communication module, and set a plurality of experimental schemes for fracture plugging based on the target feature particle size, and conduct fracture plugging experiments based on the plurality of experimental schemes under different fracture width conditions to obtain experimental results. The experimental module 130 may also be configured to evaluate, based on the experimental results, a plurality of fracture plugging effects of each of the plurality of experimental schemes under different fracture width conditions.

In some embodiments, the plurality of experimental schemes may include a particle size of the lost circulation material used to conduct the fracture plugging experiments.

The particle size of the lost circulation material refers to data related to the particle size of the plugging particles in the lost circulation material. In some embodiments, the particle size of the lost circulation material may include a maximum particle size $D_L$, a minimum particle size $D_S$, and the target feature particle size.

It is understood that when the lost circulation material is used for plugging the formation fracture, the plugging particles may enter the fracture along with the drilling fluid, and the particles may retain, bridge, fill and seal within the fracture under the action of friction, collision and other effects, and ultimately form a stable and compact plugging zone. Therefore, in order to make the plugging zone formed by the plugging particles sufficiently compact, reasonable distribution of the particle size of the plugging particles is required.

In some embodiments, the optimization system 100 may set the plurality of experimental schemes for fracture plugging based on the principle of compact particle packing.

Merely by way of example, the principle of compact particle packing may be expressed by the following equation (1):

$$CPTF = \frac{D^n - D_S^n}{D_L^n - D_S^n} \times 100\% \tag{1}$$

wherein, CPTF denotes a cumulative mass of the plugging particles with a particle size lower than D, D denotes any target feature particle size, $D_L$ denotes the maximum particle size, $D_S$ denotes the minimum particle size, and n denotes a particle distribution coefficient.

The particle distribution coefficients may be configured to characterize the uniformity of the distribution of the particle size of the plugging particles. The smaller the value of the particle distribution coefficient, the more uniform the distribution of the particle size of the plugging particles. In some embodiments, the particle distribution coefficient may be preset based on the historical experience. For example, the particle distribution coefficient may be 0.37.

Merely by way of example, the plurality of experimental schemes set by the optimization system 100 may be shown in Table 1:

TABLE 1

| | | Experimental schemes | | | | |
| --- | --- | --- | --- | --- | --- | --- |
| | | Particle feature size/mm | | | | |
| $D_S$/mm | $D_L$/mm | $D_{90}$ | $D_{75}$ | $D_{50}$ | $D_{25}$ | $D_{10}$ |
| 0.2 | 3.0 | 2.5 | 1.9 | 1.1 | 0.5 | 0.2 |
| | 2.4 | 2.0 | 1.5 | 0.9 | 0.5 | |
| | 2.0 | 1.7 | 1.3 | 0.8 | 0.4 | |
| | 1.7 | 1.5 | 1.1 | 0.7 | 0.4 | |
| | 1.4 | 1.2 | 0.9 | 0.6 | 0.4 | |
| | 1.0 | 0.9 | 0.7 | 0.5 | 0.3 | |

According to some embodiments of the present disclosure, the experimental schemes may be more informative based on the principle of compact particle packing.

In some embodiments, the optimization system 100 may conduct the fracture plugging experiments using the visual experimental device based on the plurality of experimental schemes under different fracture width conditions to obtain the experimental results. More descriptions may be found in FIG. 15 and related descriptions thereof.

The fracture width condition refers to a width of a fracture mouth in the fracture plugging experiments. In some embodiments, the fracture width condition may be preset based on practical needs, such as 2.5 mm×1 mm, 3 mm×1.5 mm, or the like.

In some embodiments, the experimental results may include, corresponding to each of the plurality of experimental schemes, a pressure bearing capacity of the plugging zone, a cumulative fluid loss, a plugging position, a plugging length, a particle-fracture ratio, a particle size distribution coefficient of a core bridging particle, and a particle size distribution coefficient of a secondary bridging particle.

The pressure bearing capacity of the plugging zone may be configured to characterize the capacity of the plugging zone to withstand pressure. In some embodiments, the pressure bearing capacity of the plugging zone may be characterized by a pressure difference between two ends of the plugging zone. The smaller the pressure difference between the two ends of the plugging zone, the stronger the pressure bearing capacity of the plugging zone.

In some embodiments, the optimization system 100 may obtain the pressure difference between the two ends of the plugging zone via a pressure detection device. More descriptions regarding the pressure detection device may be found in FIG. 15 and related descriptions thereof.

In some embodiments, the optimization system 100 may obtain the cumulative fluid loss amount via a fluid metering device. More descriptions regarding the fluid metering device may be found in FIG. 15 and related descriptions thereof.

The plugging position refers to a distance between a front end of the plugging zone and the fracture mouth. The plugging length refers to a length of the plugging zone. In some embodiments, the plugging position and the plugging length may be obtained in various ways. For example, a technician may manually measure the plugging position and the plugging length and input the plugging position and the plugging length into the optimization system. As another example, the optimization system may include a measurement device. The measurement device may be configured to measure the plugging position and the plugging length. The manner of obtaining the plugging position and the plugging length is not limited in the present disclosure.

The particle-fracture ratio is used to characterize a proportion of the volume of the plugging particles in the volume of fracture voids. The higher the particle-fracture ratio, the greater the proportion of the volume of the plugging particles in the volume of the fracture voids.

The core bridging particle refers to a plugging particle that plays a primary role in the plugging particles used for bridging. The secondary bridging particle refers to a plugging particle that plays a secondary role in the plugging particles used for bridging. The particle size distribution coefficient is used to characterize the uniformity of the particle size distribution of the plugging particles. The larger the particle size distribution coefficient, the more types of particle sizes of the plugging particles, and the more non-uniform the particle size distribution.

The manner of obtaining the particle-fracture ratio, and the particle size distribution coefficients of the core bridging particle and the secondary bridging particle may be found in the present disclosure below.

Merely by way of example, the optimization system 100 may conduct the fracture plugging experiments under the fracture width condition of 2.5 mm×1 mm based on the plurality of experimental schemes. The experimental results may be shown in Table 2 and FIGS. 2-8:

TABLE 2

| | Experimental results | | | | | | | | | | |
|---|---|---|---|---|---|---|---|---|---|---|---|
| | Particle feature size/mm | | | | | pressure bearing capacity/ | cumulative fluid | | plugging position/ | Plugging length/ | | |
| No. | $D_{90}$ | $D_{75}$ | $D_{50}$ | $D_{25}$ | $D_{10}$ | MPa | loss/kg | R | mm | mm | $S_{90}$ | $S_{75}$ |
| A1 | 2.50 | 1.81 | 0.86 | 0.60 | 0.20 | 14 | 0.45 | 1.00 | 0 | / | — | — |
| A2 | 2.50 | 1.70 | 1.14 | 0.23 | 0.20 | 17 | 0.38 | 1.00 | 0 | / | — | — |
| A3 | 2.30 | 1.73 | 1.44 | 0.72 | 0.20 | 5 | 1.30 | 0.92 | 102 | 26 | — | — |
| A4 | 2.30 | 1.49 | 1.35 | 0.54 | 0.20 | 10 | 0.82 | 0.92 | 0 | / | — | — |
| A5 | 2.00 | 1.63 | 1.25 | 0.38 | 0.20 | 14 | 0.56 | 0.80 | 155 | 35 | 1.30 | 1.00 |
| A6 | 1.88 | 1.27 | 0.67 | 0.40 | 0.20 | 13 | 0.09 | 0.75 | 151 | 41 | 2.20 | 1.30 |
| A7 | 1.88 | 1.41 | 0.94 | 0.56 | 0.20 | 17 | 0.19 | 0.75 | 136 | 48 | 1.40 | 0.90 |
| A8 | 1.75 | 1.22 | 0.96 | 0.41 | 0.20 | 15 | 0.33 | 0.70 | 133 | 63 | 1.40 | 0.85 |
| A9 | 1.75 | 1.23 | 1.16 | 0.47 | 0.20 | 8 | 0.75 | 0.70 | 174 | 25 | 1.10 | 0.65 |
| A10 | 1.63 | 1.15 | 0.68 | 0.41 | 0.20 | 17 | 0.82 | 0.65 | 133 | 65 | 1.80 | 1.10 |
| A11 | 1.50 | 0.95 | 0.88 | 0.26 | 0.20 | 12 | 0.21 | 0.60 | 99 | 50 | 1.41 | 0.78 |
| A12 | 1.50 | 1.10 | 0.80 | 0.50 | 0.20 | 9 | 1.00 | 0.60 | 68 | 35 | 1.25 | 0.75 |
| A13 | 1.38 | 1.00 | 0.63 | 0.38 | 0.20 | 15 | 0.50 | 0.55 | 117 | 82 | 1.60 | 1.00 |
| A14 | 1.38 | 0.95 | 0.53 | 0.32 | 0.20 | 16 | 0.37 | 0.55 | 130 | 69 | 2.00 | 1.20 |
| A15 | 0.90 | 0.70 | 0.50 | 0.31 | 0.20 | 0 | 2.00 | 0.33 | 200 | / | — | — |

In Table 2, the plugging position of "0" indicates that the lost circulation materials seal the fracture mouth, the plugging position of "200" indicates that the plugging particles loss completely and do not form the plugging zonezone, and the plugging length of "/" indicates that the length of the plugging zone cannot be measured; $S_{90}$ denotes the particle size distribution coefficient of the core bridging particles, $S_{75}$ denotes the particle size distribution coefficient of the secondary bridging particles, and the values of "-" for $S_{90}$ and $S_{75}$ indicate that the corresponding experimental groups are excluded experimental groups.

In some embodiments, the fracture plugging effect may be characterized by the pressure bearing capacity of the plugging zone and the cumulative fluid loss. In some embodiments, the fracture plugging effect may be negatively correlated with the cumulative fluid loss and positively correlated with the pressure bearing capacity of the plugging zone.

In some embodiments, if the cumulative fluid loss is fixed, when the pressure difference between the two ends of the plugging zone is less than a first threshold, the optimization system 100 may determine that the fracture plugging effect is a first effect. When the pressure difference between the two ends of the plugging zone is greater than or equal to the first threshold and less than a second threshold, the optimization system 100 may determine that the fracture plugging effect is a second effect. When the pressure difference between the two ends of the plugging zone is greater than or equal to the second threshold and is less than a third threshold, the optimization system 100 may determine that the fracture plugging effect is a third effect. When the pressure difference between the two ends of the plugging zone is greater than or equal to the third threshold, the optimization system 100 may determine that the fracture plugging effect is a fourth effect. The first effect, the second effect, the third effect, and the fourth effect refer to grades used to classify the pressure bearing capacity of the plugging zone. The higher the grade, the better the pressure bearing capacity of the plugging zone.

The first threshold, the second threshold, and the third threshold may be preset based on the historical experience. The first threshold may be less than the second threshold, and the second threshold may be less than the third threshold. For example, the first threshold may be 8 MPa, the second threshold may be 12 MPa, and the third threshold may be 16 MPa.

According to some embodiments of the present disclosure, the fracture plugging effect may be characterized by the pressure bearing capacity of the plugging zone and the cumulative fluid loss, such that a more refined fracture plugging effect can be obtained, thereby determining a more accurate particle size distribution rule based on the fracture plugging effect.

In some embodiments, the experimental results may also include pressure detection data and drilling fluid flow data. More descriptions regarding the pressure detection data and the drilling fluid flow data may be found in FIG. 15 and related descriptions thereof.

In some embodiments, the optimization system 100 may predict a fracture plugging effect in a future time period corresponding to each of the plurality of experimental schemes based on a first parameter corresponding to each of the plurality of experimental schemes, the pressure detection data, and the drilling fluid flow data. More descriptions regarding the first parameter may be found in FIG. 15 and related descriptions thereof.

In some embodiments, the optimization system 100 may query, based on first data under matching, a preset table for first reference data that is the same as the first data under matching, and determine a fracture plugging effect corresponding to the first reference data as the fracture plugging effect in the future time period corresponding to each of the plurality of experimental schemes. The first data under matching refers to a combination of the first parameter corresponding to each of the plurality of experimental schemes, the pressure detection data, and the drilling fluid flow data.

In some embodiments, the preset table may be preset based on historical data. The preset table may include a plurality of first reference data and fracture plugging effects corresponding to the plurality of first reference data. The plurality of first reference data refers to a combination of historical first parameters corresponding to a set of historical experimental schemes, historical pressure detection data, and historical drilling fluid flow data. The fracture plugging effects corresponding to the plurality of first reference data refer to actual fracture plugging effects corresponding to the historical experimental schemes.

According to some embodiments of the present disclosure, the fracture plugging effect of the experiment can be predicted by the first parameter, and the pressure detection data and the drilling fluid flow data during a time period at the beginning of the experiment, thereby saving the time of the experiment, and ending the experiment earlier.

The particle size distribution optimization model 140 may be configured to obtain the plurality of fracture plugging effects from the experimental module via the communication module, determine a particle size distribution rule based on the plurality of fracture plugging effects, and obtain optimized particle size distribution data by optimizing the particle size distribution of the lost circulation material based on the particle size distribution rule.

The particle size distribution rule refers to requirements associated with optimizing the particle size distribution of the lost circulation material. In some embodiments, the particle size distribution rule may include the particle-fracture ratio and the particle size distribution coefficient. The particle size distribution coefficient may include the particle size distribution coefficient of the core bridging particle and the particle size distribution coefficient of the secondary bridging particle.

In some embodiments, the particle-fracture ratio and the particle size distribution coefficient in the particle size distribution rule may include a value range the particle-fracture ratio and a value range the particle size distribution coefficient.

In some embodiments, the particle-fracture ratio and the particle size distribution coefficient corresponding to each of the plurality of experimental schemes may be calculated using a particle size distribution model, and the value range of the particle-fracture ratio and the value range of the particle size distribution coefficient may be determined based on the fracture plugging effect of each of the plurality of experimental schemes.

In some embodiments, the particle-fracture ratio may be correlated with $D_{90}$ and the opening of the fracture mouth. For example, the optimization system 100 may calculate the particle-fracture ratio R corresponding to each of the plurality of experimental schemes by the following equation (2):

$$R = D_{90}/W_{in} \qquad (2)$$

wherein R denotes the ratio of characteristic size $D_{90}$ of plugging particles to the fracture opening, and $W_{in}$ denotes the opening of the fracture mouth.

In some embodiments, the particle size distribution coefficient may be correlated with $D_{90}$, $D_{75}$, $D_{50}$, and $D_{25}$. For example, the optimization system 100 may calculate the particle size distribution coefficients corresponding to each of the plurality of experimental schemes by the following equations (3) and (4):

$$S_{90} = \frac{(D_{90} - D_{25})}{D_{50}} \quad (3)$$

$$S_{75} = \frac{(D_{75} - D_{25})}{D_{50}} \quad (4)$$

For example, the optimization system 100 may conduct the fracture plugging experiments based on the plurality of experimental schemes under the fracture width condition of 2.5 mm×1 mm. The experimental results may be shown in Table 2 and FIGS. 2-8.

Figure 2:
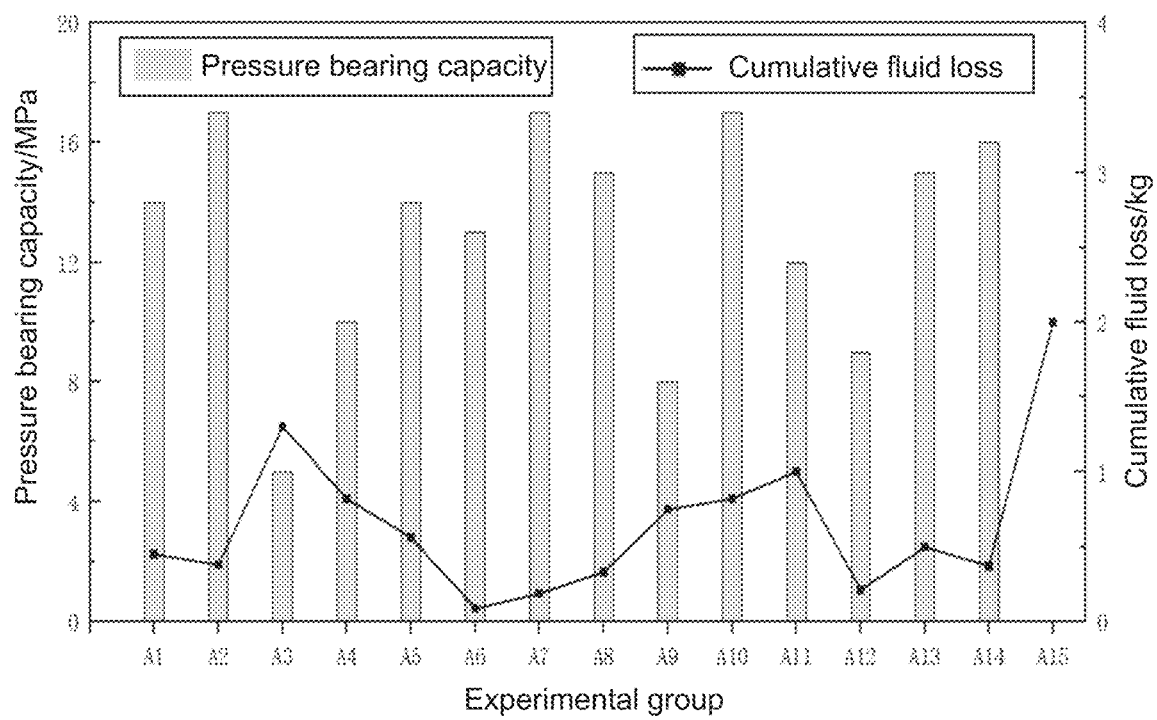
FIG. 2 is a schematic diagram illustrating results of a pressure bearing capacity of a plugging zone and a leakage under different particle size distributions according to some embodiments of the present disclosure.

The horizontal coordinate of FIG. 2 represents the experimental group, and the vertical coordinate of FIG. 2 represents the pressure bearing capacity and the leakage. From Table 2 and FIG. 2, it can be seen that under the fracture width condition of 2.5 mm×1 mm, the experimental groups A1-A14 have the pressure bearing capacity, and there is no complete leakage of drilling fluid in the pressure bearing process. The bearing pressure values of the experimental group A2, A7, A10, and A14 are greater than or equal to 16 MPa, and the fracture plugging effect is the fourth effect. The bearing pressure values of the experimental groups A1, A5, A6, A8, A11 and A13 are within a range of 12 MPa-16 MPa, and the fracture plugging effect is the third effect. The bearing pressure values of the experimental groups A4 and A9 are within a range of 8 MPa-12 MPa, and the fracture plugging effect is the second effect. The bearing pressure value of the experimental group A3 is only 5 MPa, and the fracture plugging effect is the first effect.

Figure 3:
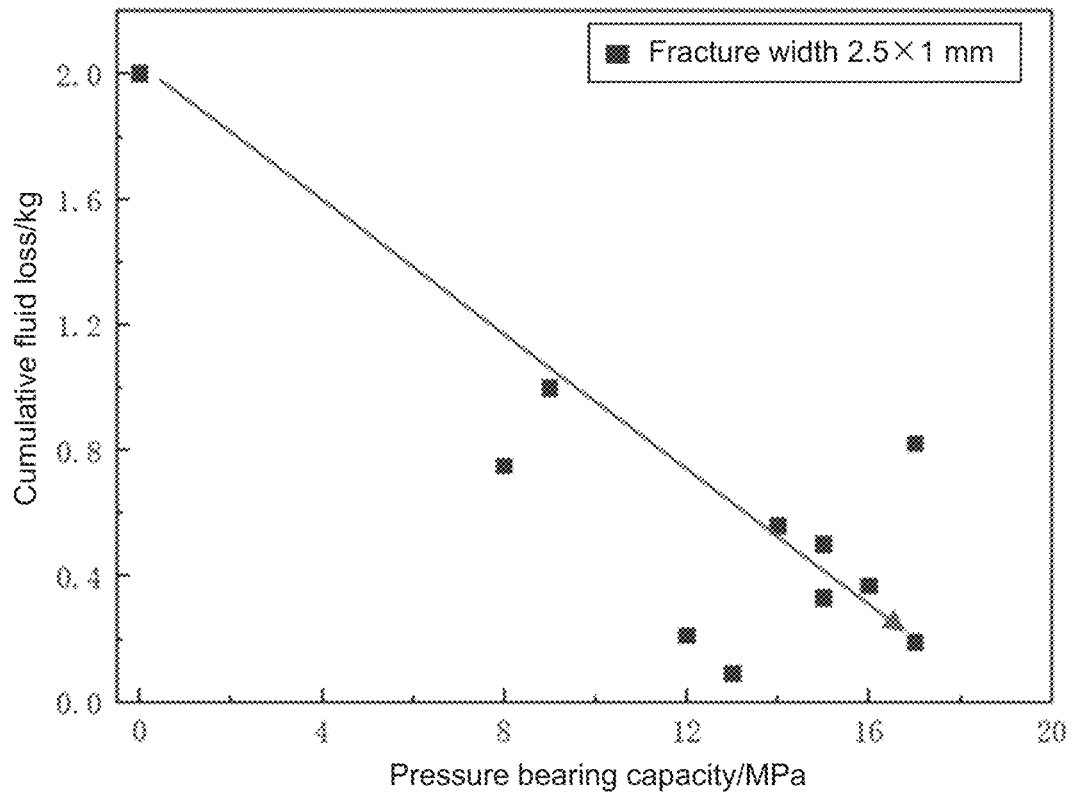
FIG. 3 is a schematic diagram illustrating a result of a relationship between a pressure bearing capacity of a plugging zone and a leakage under a fracture width of 2.5 mm×1 mm according to some embodiments of the present disclosure.

The horizontal coordinate of FIG. 3 represents the pressure bearing capacity, and the vertical coordinate of FIG. 3 represents the leakage. It can be seen from FIG. 3, as the stability of the plugging zone increases (the pressure bearing capacity of the plugging zone increases), the cumulative fluid loss tends to decrease, indicating that the porosity of the plugging particles after filling and plugging tends to decrease, and the compactness of the plugging zone becomes better as a whole (the cumulative fluid loss decreases). The porosity refers to the proportion of the volume of a pore space to the volume of the fracture.

The target feature particle size $D_{90}$ of the experimental groups A6 and A7 is the same, and the overall particle size of the remaining plugging particles of A6 is relatively small, making the stability of the plugging zone of A6 weaker than that of A7, but the particle size of the plugging particles is finer, making the compactness of the plugging zone of A6 better than that of A7.

The target feature particle sizes $D_{90}$ and $D_{75}$ of the experimental groups A8 and A9 are the same, but the target feature particle sizes $D_{50}$ and $D_{25}$ of A9 are relatively large. The lack of smaller particle sizes of the plugging particles to fill and seal the pore space after the bridging of the plugging particles causes the leakage at a relatively low pressure of the plugging zone of A9 and poor compactness of the plugging zone.

Compared with the experimental group A11, the target feature particle sizes $D_{75}$ and $D_{25}$ of the experimental group A12 are relatively large, and the target feature particle size $D_{50}$ of the experimental group A12 is relatively small, similar to the case of the experimental group A9, the lack of the plugging particles of smaller particle sizes to fill and seal the pore space after the bridging of the plugging particles causes more interparticle pores within the plugging zone, which results in poor stability and compactness.

Both the experimental groups A13 and A14 have better pressure bearing capacity of the plugging zone and lower cumulative fluid loss, the particle size distribution of the plugging particles is reasonable, and a stable and compact plugging zone is formed in the fracture.

Since the overall particle size distribution of the plugging particles of the experimental group A15 is too small, it is difficult for the plugging particles to retain and bridge after being transported to enter the fracture with the drilling fluid. As a result, the lost circulation material has no capability of fracture plugging, and the drilling fluid completely leaks under the initial pressure.

Figure 4:
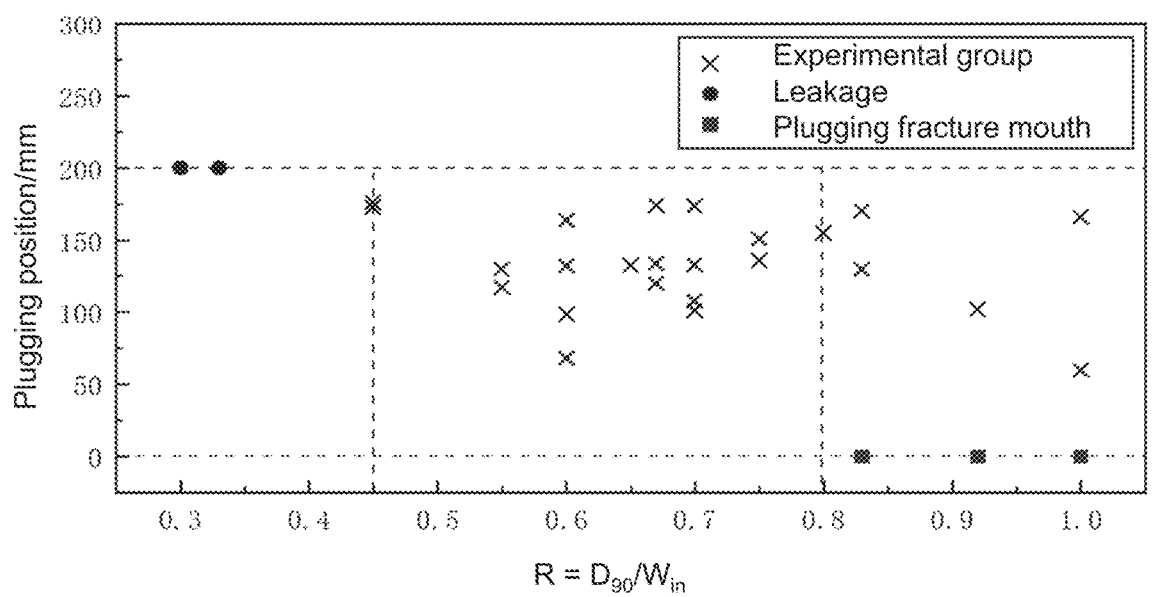
FIG. 4 is a schematic diagram illustrating results of a plugging position corresponding to different particle fracture ratios according to some embodiments of the present disclosure.

The horizontal coordinate of FIG. 4 represents the particle fracture ratio, and the vertical coordinate of FIG. 4 represents the plugging position. From Table 2 and FIG. 4, it can be seen that when the particle-fracture ratio is greater than 0.8, the plugging particles in the lost circulation material may accumulate at the fracture mouth, and with the subsequent plugging particles filling and sealing the pore space between the particles, the plugging particles eventually form a plug zone at the fracture mouth, resulting in the "plugging fracture mouth" phenomenon.

In an actual working condition, the plugging zone formed at the fracture mouth is usually located on a wall surface of the wellbore. When the wellbore pressure fluctuates due to the tripping in/out a drill pipe and the termination of pumping, it is easy to cause a negative pressure difference between the wellbore and the formation pressure, and the plugging zone subjected to "plugging fracture mouth" is easily destroyed by the impact of the drilling fluid flowing back from the fracture, resulting in repeated leakage.

When the particle fracture ratio is greater than 0.8, there are still some experimental groups that form the plugging zone inside the fracture. Since there are a large number of plugging particles with particle sizes smaller than the fracture width of the fracture mouth in the plugging particles, when the plugging particles are transported to the inside of the fracture with the drilling fluid, the irregularity of the plugging particles and the random flow of drilling fluid cause that only a small number of plugging particles with larger particle sizes bridge at the fracture mouth, which cannot prevent the plugging particles from continuing to move into the fracture. In this case, the plugging particles with smaller particle sizes become the core bridging particles to retain and bridge inside the fracture, and form the stable plugging zone inside the fracture with the filling and sealing effect of the plugging particles with smaller particle sizes.

When the particle fracture ratio is within a range of 0.45-0.8, the lost circulation materials under different fracture width conditions form the plugging zone inside the fracture. With the decrease of the target feature particle size $D_{90}$ of the plugging particles, the bridging mode of the plugging zone develops gradually from single-particle bridging to hybrid bridging and multi-particle bridging.

When the particle fracture ratio is within a range of 0.6-0.8, the bridging mode of the plugging zone is multi-particle-single-particle hybrid bridging. In this case, the bridging position of the plugging particles is distributed in the front, middle, and rear sections of the fracture. When the particle fracture ratio is within a range of 0.45-0.6, the bridging mode of the plugging zone transitions from multi-particle-single-particle hybrid bridging to multi-particle bridging as the particle fracture ratio decreases. With the particle size of the bridging particles decreases, it is more difficult for the plugging particles to bridge and block in the front section of a fracture plate, and the formed plugging zone is located in the middle and rear sections of the fracture.

When the particle fracture ratio is less than 0.45, the overall particle size of the lost circulation material is small, and the plugging particles flow out of the fracture together with the drilling fluid, and cannot retain and bridge to form the plugging zone inside the fracture.

Figure 5:
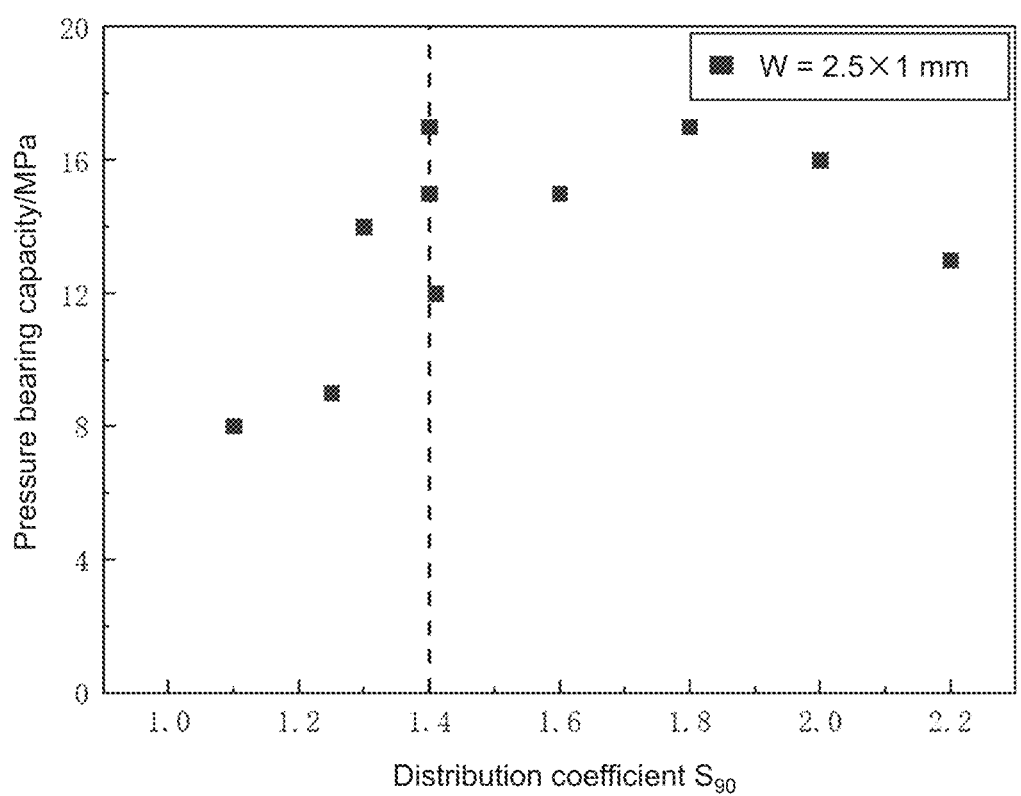
FIG. 5 is a schematic diagram illustrating results of a pressure bearing capacity of a plugging zone under different particle size distribution coefficients $S_{90}$ according to some embodiments of the present disclosure.
Figure 6:
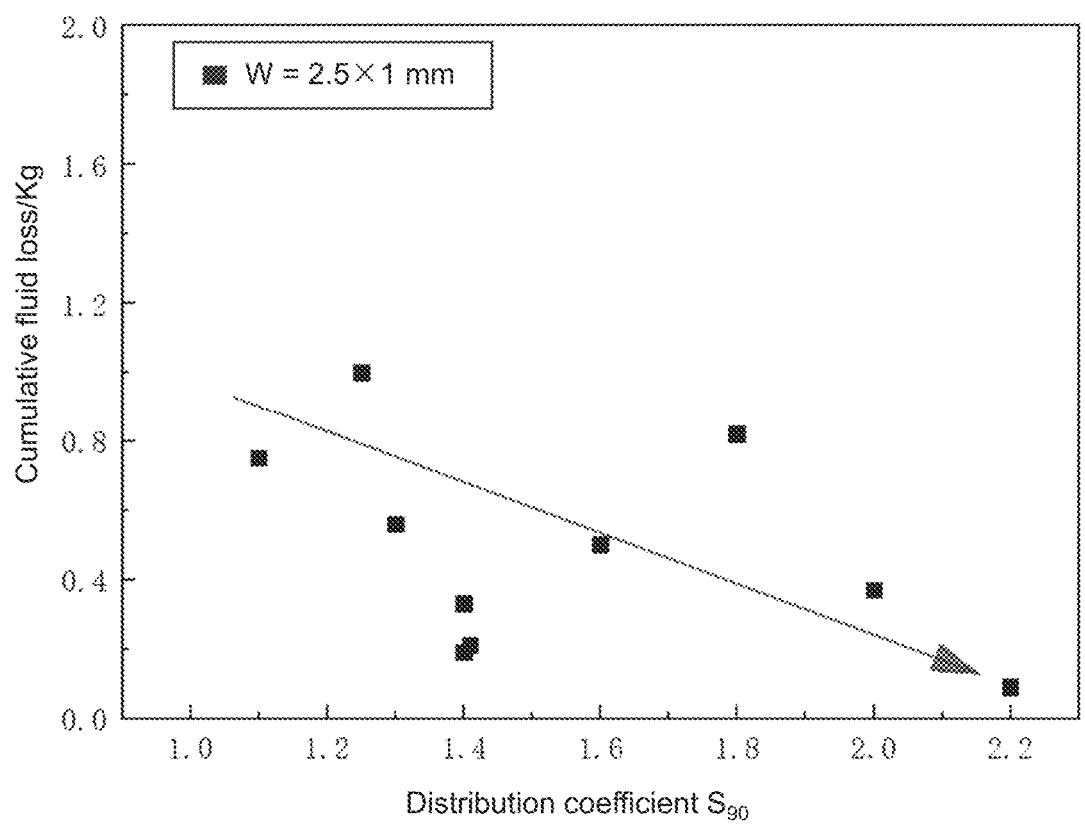
FIG. 6 is a schematic diagram illustrating results of a cumulative fluid loss under different particle size distribution coefficients $S_{90}$ according to some embodiments of the present disclosure.
Figure 7:
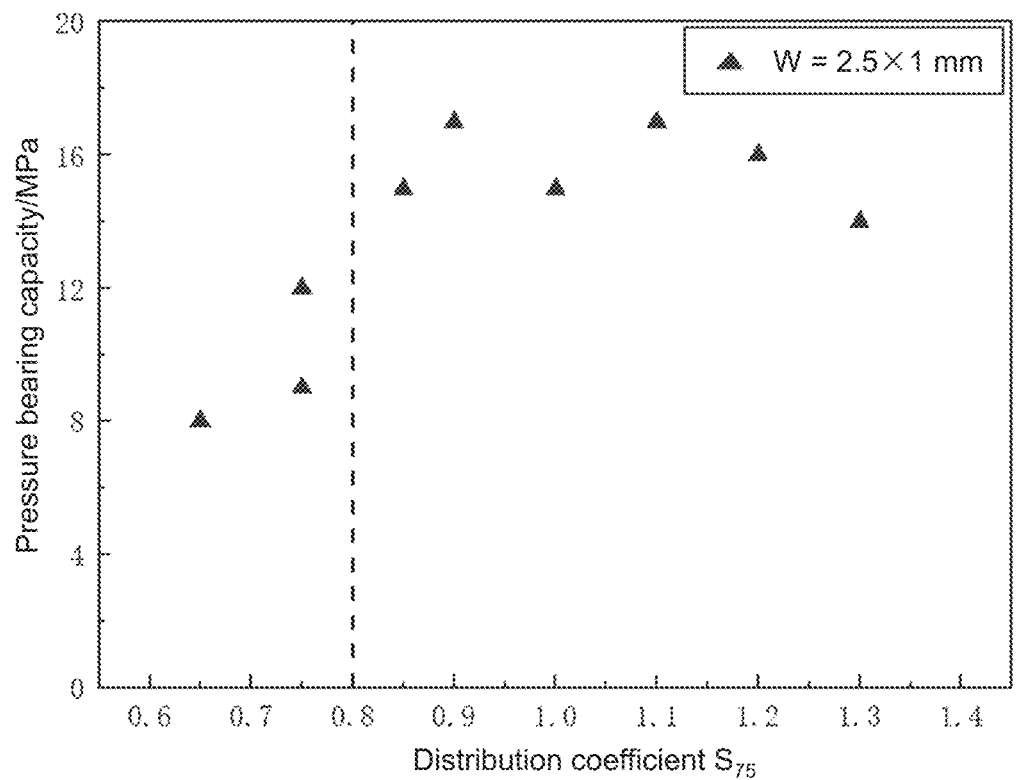
FIG. 7 is a schematic diagram illustrating results of a pressure bearing capacity of a plugging zone under different particle size distribution coefficients $S_{75}$ according to some embodiments of the present disclosure.
Figure 8:
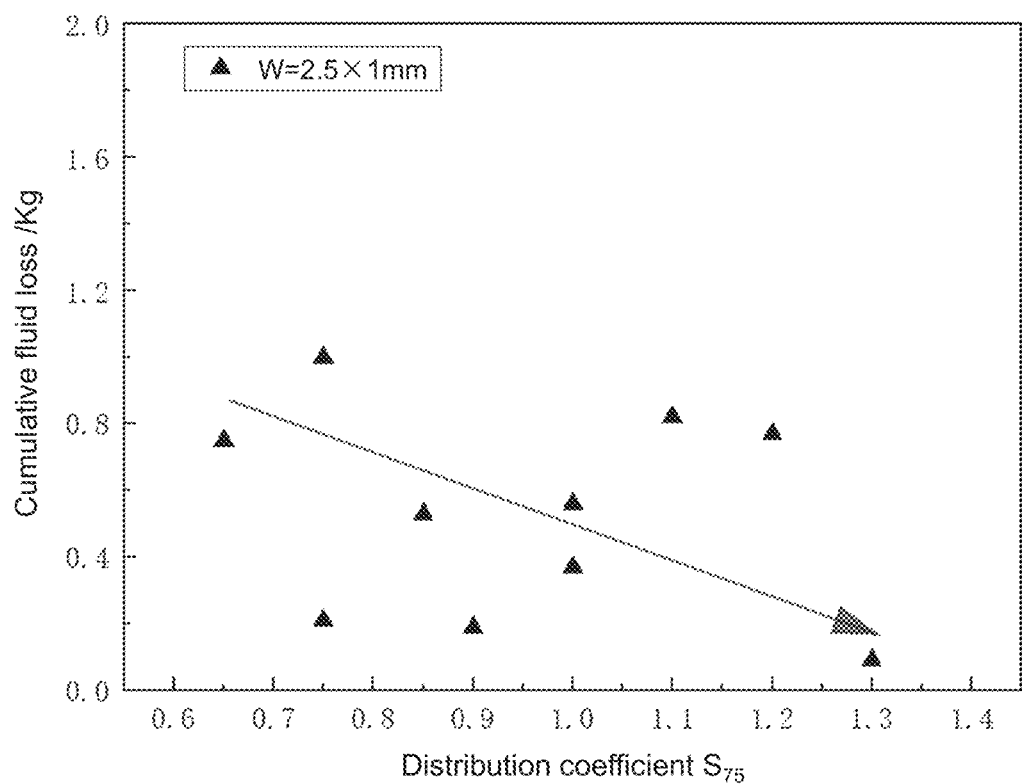
FIG. 8 is a schematic diagram illustrating results of a cumulative fluid loss under different particle size distribution coefficients $S_{75}$ according to some embodiments of the present disclosure.

The horizontal coordinate of FIG. 5 represents the distribution coefficient $S_{90}$, and the vertical coordinate of FIG. 5 represents the pressure bearing capacity. The horizontal coordinate of FIG. 6 represents the distribution coefficient $S_{90}$, and the vertical coordinate of FIG. 6 represents the leakage. The horizontal coordinate of FIG. 7 represents the distribution coefficient $S_{75}$, and the vertical coordinate of FIG. 7 represents the pressure bearing capacity. The horizontal coordinate of FIG. 8 represents the distribution coefficient $S_{75}$, and the vertical coordinate of FIG. 8 represents the leakage.

From FIGS. 5-8, it can be seen that as the distribution coefficients $S_{90}$ and $S_{75}$ become larger, the pressure bearing capacity of the plugging zone tend to increase, and the cumulative fluid loss tends to decrease. However, due to the use of stepped pressurization, the higher the pressure bearing capacity of the plugging zone, the longer the experimental time, which leads to a relatively large leakage when the distribution coefficients $S_{90}$ and $S_{75}$ are relatively large.

The distribution coefficient $S_{90}$ of 1.4 is the critical point of the quality change of the pressure bearing capacity of the plugging zone. When the distribution coefficient $S_{90}$ is less than 1.4, the stability of the plugging zone formed by the lost circulation material inside the fracture is medium. With the decrease of the distribution coefficient, the stability of the plugging zone becomes worse, and the pressure bearing capacity of the plugging zone is reduced.

When the distribution coefficient $S_{90}$ is greater than 1.4, the stability of the plugging zone is greatly improved, and the pressure bearing capacity of the plugging zone is all greater than the second threshold, in which the pressure bearing capacity of the plugging zone corresponding to some particle size distribution coefficients reaches 17 MPa, realizing the optimal stability.

From the cumulative fluid loss corresponding to the particle size distribution coefficient $S_{90}$, it can be seen that with the increase of the particle size distribution coefficient $S_{90}$, the overall leakage tends to decrease, but the negative correlation between the leakage and the distribution coefficient $S_{90}$ is weak. The particle size distribution coefficient $S_{75}$ of 0.8 is also the critical point of the pressure bearing capacity of the plugging zone. When the particle size distribution coefficient $S_{75}$ is less than 0.8, the pressure bearing capacity of the plugging zone is less than 12 MPa. With the particle size distribution coefficient $S_{75}$ decreases, the pressure bearing capacity of the plugging zone decreases. When the particle size distribution coefficient $S_{75}$ is greater than 0.8, the pressure bearing capacity of the plugging zone is significantly enhanced. The pressure bearing capacity of the plugging zone is greater than 12 MPa, and the maximum pressure bearing capacity of 17 MPa does not cause damage and destabilization, realizing a good pressure bearing capacity of the plugging zone.

From the cumulative fluid loss corresponding to the particle size distribution coefficient $S_{75}$, it can be seen that with the increase of the distribution coefficient $S_{75}$, the overall leakage tends to decrease, and there is an obvious high point of leakage when the distribution coefficient $S_{75}$ is relatively large. In this case, the compactness of the plugging zone is poor.

According to some embodiments of the present disclosure, the optimization system 100 may study the correlation between the pressure bearing capacity of the plugging zone and the distribution coefficients $S_{75}$ and $S_{90}$, respectively using correlation analysis, such as Pearson, Spearman, etc. The results may be shown in Table 3.

TABLE 3

Correlation between the distribution coefficient and pressure bearing capacity under the fracture width of 2.5 mm × 1 mm

| Distribution coefficient | Pearson correlation | | Spearman correlation | |
| --- | --- | --- | --- | --- |
| | Correlation coefficient | p-value | Correlation coefficient | p-value |
| $S_{90}$ | 0.704 | 0.011 | 0.706 | 0.010 |
| $S_{75}$ | 0.639 | 0.025 | 0.633 | 0.027 |

The correlation coefficient is used to characterize the strength of the correlation. The higher the correlation coefficient, the stronger the correlation. The p-value is used to characterize the level of significance of the correlation coefficient. The smaller the p-value, the more likely the correlation coefficient is true.

From Table 3, it can be seen that the values of the correlation coefficient between the pressure bearing capacity of the plugging zone and the distribution coefficient $S_{90}$ are 0.704 and 0.706, respectively, showing a significant correlation at the level of 0.05, which indicates that the pressure bearing capacity of the plugging zone and the distribution coefficient $S_{90}$ have a significant positive correlation. The values of the correlation coefficient between the pressure bearing capacity of the plugging zone and the distribution coefficient $S_{75}$ are 0.639 and 0.633 respectively, showing a significant correlation at the level of 0.05, which indicates that the pressure bearing capacity of the plugging zone and the distribution coefficient $S_{75}$ have a significant positive correlation.

Combining the analysis of Table 2 and FIGS. 2-8, the optimization system 100 may determine the particle size distribution rule as $0.45 \leq R \leq 0.8$, $S_{90} > 1.4$, and $S_{75} > 0.8$ when the fracture width is 2.5 mm×1 mm.

Merely by way of example, the optimization system 100 may conduct the fracture plugging experiments based on the plurality of experimental schemes as shown in Table 4 below under the fracture width condition of 3 mm× 1.5 mm. The experimental results may be shown in Table 5 and FIGS. 9-14:

TABLE 4

Experimental schemes

| | | Particle feature size/mm | | | | |
| --- | --- | --- | --- | --- | --- | --- |
| $D_S$/mm | $D_L$/mm | $D_{90}$ | $D_{75}$ | $D_{50}$ | $D_{25}$ | $D_{10}$ |
| 0.2 | 3.4 | 2.8 | 2.1 | 1.2 | 0.6 | 0.2 |
| | 3.0 | 2.5 | 1.9 | 1.1 | 0.5 | |
| | 2.4 | 2.0 | 1.5 | 0.9 | 0.5 | |
| | 2.0 | 1.7 | 1.3 | 0.8 | 0.4 | |
| | 1.7 | 1.5 | 1.1 | 0.7 | 0.4 | |
| | 1.4 | 1.2 | 0.9 | 0.6 | 0.4 | |
| | 1.0 | 0.9 | 0.7 | 0.5 | 0.3 | |

TABLE 5

Experimental results

| No. | Particle feature size/mm | | | | | Pressure bearing capacity/ MPa | Cumulative fluid loss/kg | R | Plugging position/ mm | Plugging length/ mm | $S_{90}$ | $S_{75}$ |
|---|---|---|---|---|---|---|---|---|---|---|---|---|
| | $D_{90}$ | $D_{75}$ | $D_{50}$ | $D_{25}$ | $D_{10}$ | | | | | | | |
| B1 | 3.00 | 1.80 | 1.50 | 0.80 | 0.20 | 9 | 0.72 | 1.00 | 166 | 29 | — | — |
| B2 | 3.00 | 2.20 | 1.20 | 0.60 | 0.20 | 14 | 0.73 | 1.00 | 0 | / | — | — |
| B3 | 2.50 | 1.80 | 1.20 | 0.60 | 0.20 | 11 | 0.41 | 0.83 | 0 | / | — | — |
| B4 | 2.50 | 1.80 | 1.50 | 0.60 | 0.20 | 7 | 0.16 | 0.83 | 170 | 30 | — | — |
| B5 | 2.50 | 1.60 | 1.20 | 0.40 | 0.20 | 17 | 0.21 | 0.83 | 130 | 55 | 1.80 | 0.70 |
| B6 | 2.10 | 1.10 | 0.90 | 0.46 | 0.20 | 17 | 0.56 | 0.70 | 101 | 95 | 2.00 | 1.10 |
| B7 | 2.10 | 1.34 | 0.84 | 0.42 | 0.20 | 17 | 0.46 | 0.70 | 108 | 81 | 1.42 | 1.25 |
| B8 | 2.00 | 1.80 | 1.20 | 0.30 | 0.20 | 15 | 0.72 | 0.67 | 174 | 25 | 1.40 | 0.90 |
| B9 | 2.00 | 1.60 | 1.00 | 0.60 | 0.20 | 10 | 0.76 | 0.67 | 134 | 23 | 1.42 | 1.00 |
| B10 | 2.00 | 1.50 | 1.20 | 0.30 | 0.20 | 16 | 0.36 | 0.67 | 120 | 75 | 1.60 | 1.20 |
| B11 | 1.80 | 1.40 | 1.00 | 0.20 | 0.20 | 17 | 0.30 | 0.60 | 132 | 60 | 2.20 | 1.40 |
| B12 | 1.80 | 1.27 | 0.67 | 0.33 | 0.20 | 15 | 0.52 | 0.60 | 164 | 38 | 1.20 | 0.80 |
| B13 | 1.35 | 0.99 | 0.90 | 0.27 | 0.20 | 9 | 0.07 | 0.45 | 173 | 27 | 1.29 | 0.69 |
| B14 | 1.35 | 0.90 | 0.75 | 0.38 | 0.20 | 7 | 1.1 | 0.45 | 176 | 20 | 1.80 | 0.70 |
| B15 | 0.90 | 0.41 | 0.38 | 0.23 | 0.20 | 0 | 2 | 0.30 | 200 | — | — | — |

Figure 9:
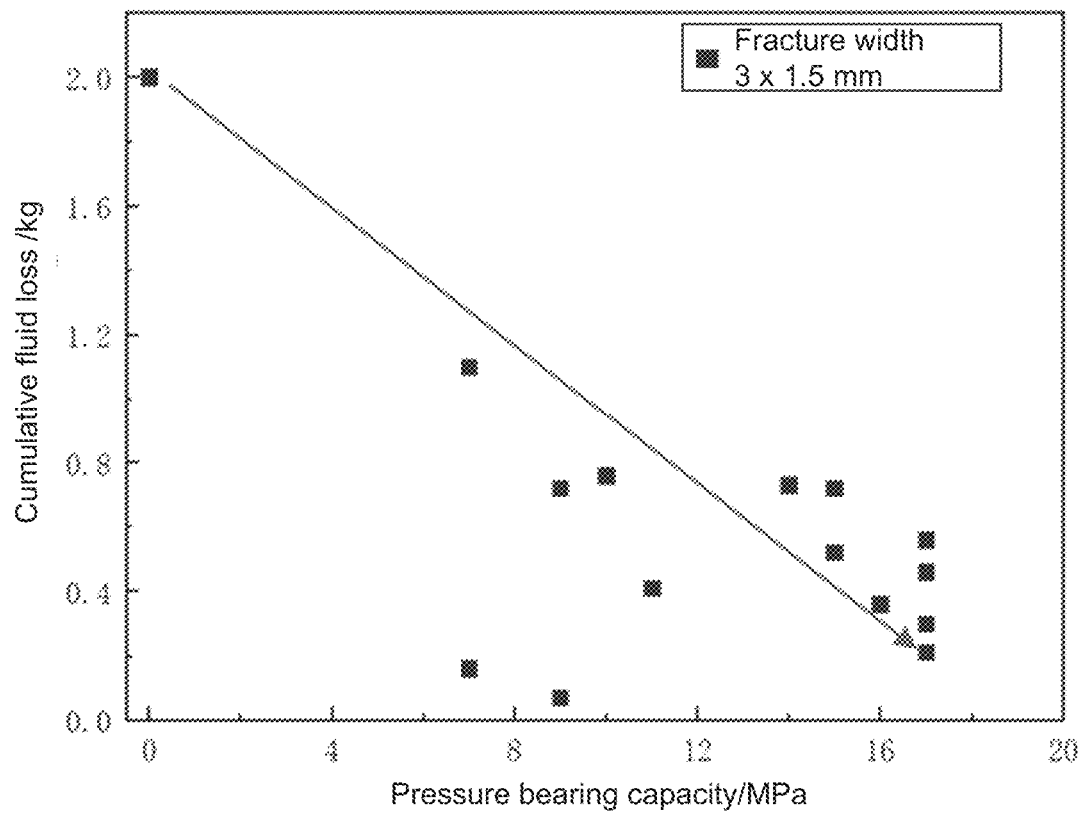
FIG. 9 is a schematic diagram illustrating a result of a relationship between a pressure bearing capacity of a plugging zone and a leakage under a fracture width of 3 mm×1.5 mm according to some embodiments of the present disclosure.

The horizontal coordinate of FIG. 9 represents the pressure capacity and the vertical coordinate of FIG. 9 represents the leakage. From Table 5 and FIG. 9, it can be seen that under the fracture width condition of 3 mm×1.5 mm, the experimental groups B1-B14 have the pressure bearing capacity, and there is no complete leakage of drilling fluid in the process of pressure bearing in the plugging zone. The pressure bearing values of the experimental groups B5, B6, B7, B10, and B11 reach 16 MPa or more, and the fracture plugging effect is the fourth effect. The pressure bearing values of the experimental groups B2, B8, and B12 are within a range of 12-16 MPa, and the fracture plugging effect is the third effect. The pressure bearing values of the experimental groups B1, B3, B9, and B13 are within a range of 8-12 MPa, and the fracture plugging effect is the second effect. The pressure bearing values of the experimental groups B4 and B14 are 7 MPa, and the fracture plugging effect is the first effect.

By observing the morphology of the plugging zone inside the fracture after the experiment, the experimental groups B2 and B3 have no plugging particles left in the front and middle sections of the fracture plate, and there are only some plugging particles with larger particle sizes inside the fracture at the exit without formation of the plugging zone. A lot of plugging particles are deposited outside the fracture mouth after the experiment, which indicates that the plugging particles bridge and block the fracture mouth, resulting in the phenomenon of "plugging fracture mouth". Therefore, when the particle size distribution coefficient is analyzed, the experimental group with the same feature particle size $D_{90}$ as the experimental groups B2 and B3 has no reference to the pressure bearing capacity and leakage.

Compared with the experimental group B7, the target feature particle size $D_{75}$ of the experimental group B6 decreases, and the target feature particle sizes $D_{50}$ and $D_{25}$ increase. The pressure bearing capacity of the plugging zone of the experimental group B6 is the same with that of the experimental group B7, but the compactness of the plugging zone of the experimental group B6 is slightly worse than that of the experimental group B7.

In the experimental groups B8, B9 and B10, the target feature particle size $D_{75}$ of the experimental group B8 increases compared with that of the experimental group B10, which has less effect on the stability of the plugging zone, but the leakage increases. The target feature particle size $D_{50}$ of the experimental group B9 decreases while the target feature particle size $D_{25}$ of the experimental group B9 increases compared with that of the experimental group B10, and the target feature particle sizes $D_{75}$ and $D_{50}$ decrease while the target feature particle size $D_{25}$ increases compared with that of the experimental group B8. Therefore, after the plugging particles of the experimental group B9 bridge within the fracture, the lack of the plugging particles of smaller particle sizes to fill and seal the inter-particle pore space causes leakage when the pressure of the plugging zone of the experimental group B9 is relatively low, and the leakage is also relatively large in the process of pressure bearing of the plugging zone.

Compared with the experimental group B11, the target feature particle sizes $D_{75}$ and $D_{50}$ of the experimental group B12 are relatively small while the target feature particle size $D_{25}$ is relatively large, thus the stability of the plugging zone of the experimental group B12 is slightly worse than that of the experimental group B11, and the leakage is larger. Compared with the experimental group B14, the target feature particle sizes $D_{75}$ and $D_{50}$ of the experimental group B13 are relatively large while the target feature particle size $D_{25}$ is relatively small, and the pressure bearing capacity is enhanced, and the densification of the plugging zone is better, and there is almost no leakage of drilling fluid in the process of pressure bearing of the plugging zone.

The particle size distribution of the plugging particles of the experimental group B15 is too small as a whole, and it is difficult for the plugging particles to retain and bridge within the fracture after the plugging particles are transported with the drilling fluid into the fracture, resulting in no fracture plugging capacity of the lost circulation material and complete leakage of the drilling fluid under the initial pressure.

Figure 10:
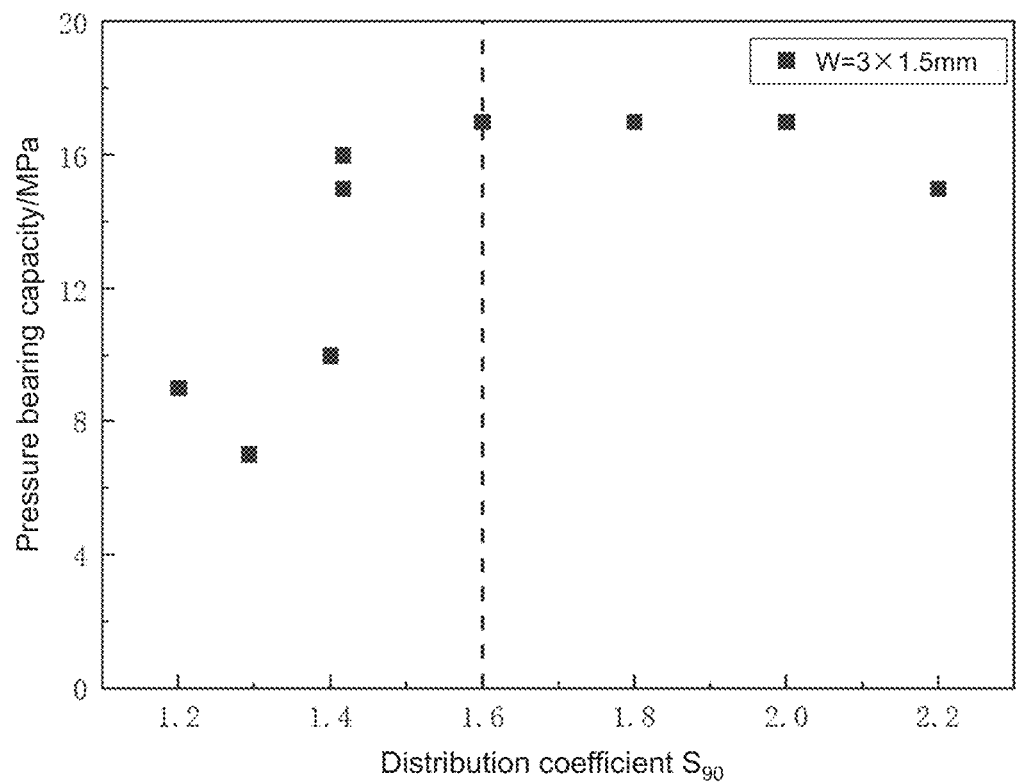
FIG. 10 is a schematic diagram illustrating results of a pressure bearing capacity of a plugging zone under different particle size distribution coefficients $S_{90}$ of the embodiment of FIG. 9.
Figure 11:
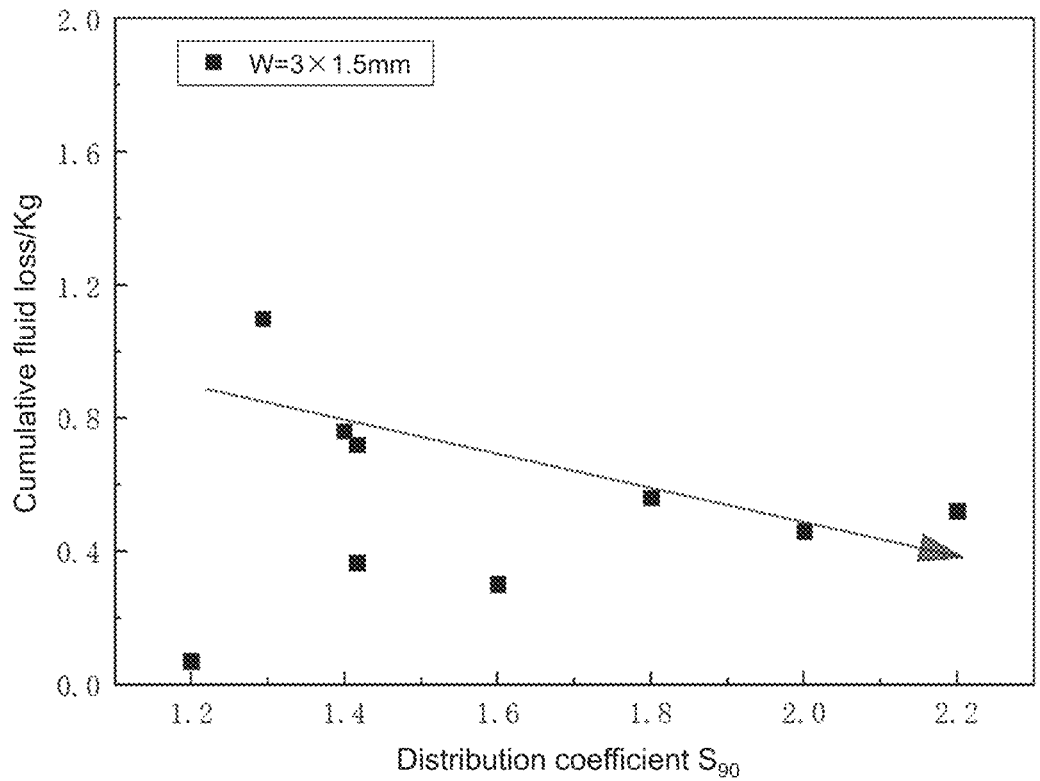
FIG. 11 is a schematic diagram illustrating results of a cumulative fluid loss under different particle size distribution coefficients $S_{90}$ of the embodiment of FIG. 9.
Figure 12:
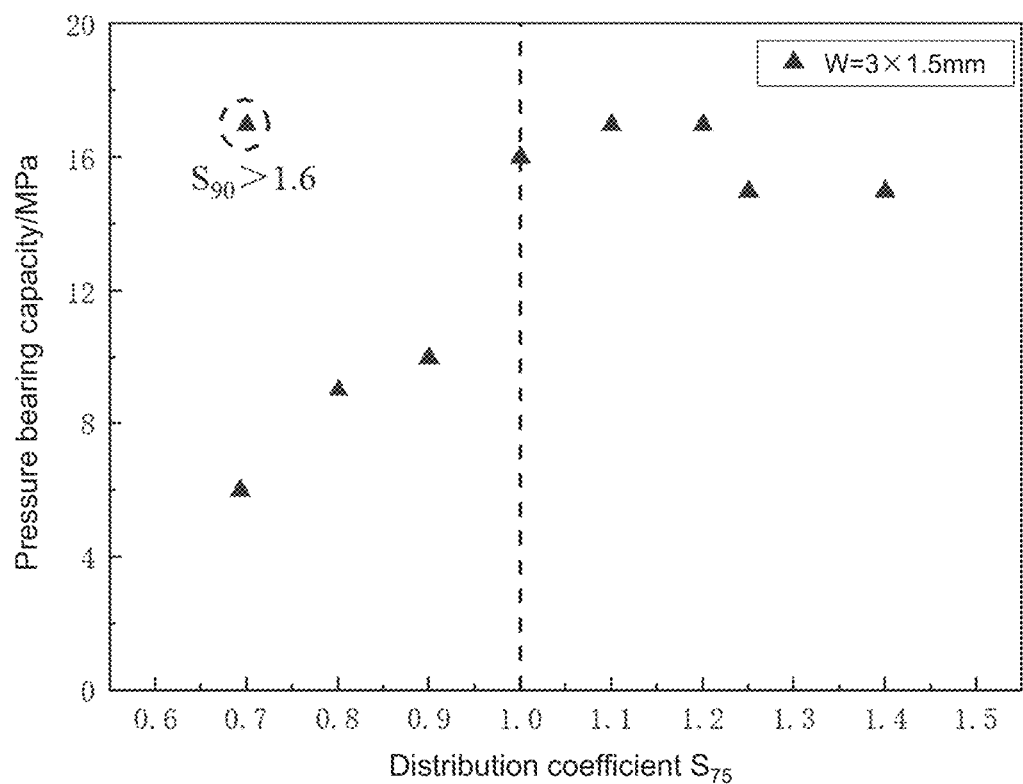
FIG. 12 is a schematic diagram illustrating results of a pressure bearing capacity of a plugging zone under different particle size distribution coefficients $S_{75}$ of the embodiment of FIG. 9.
Figure 13:
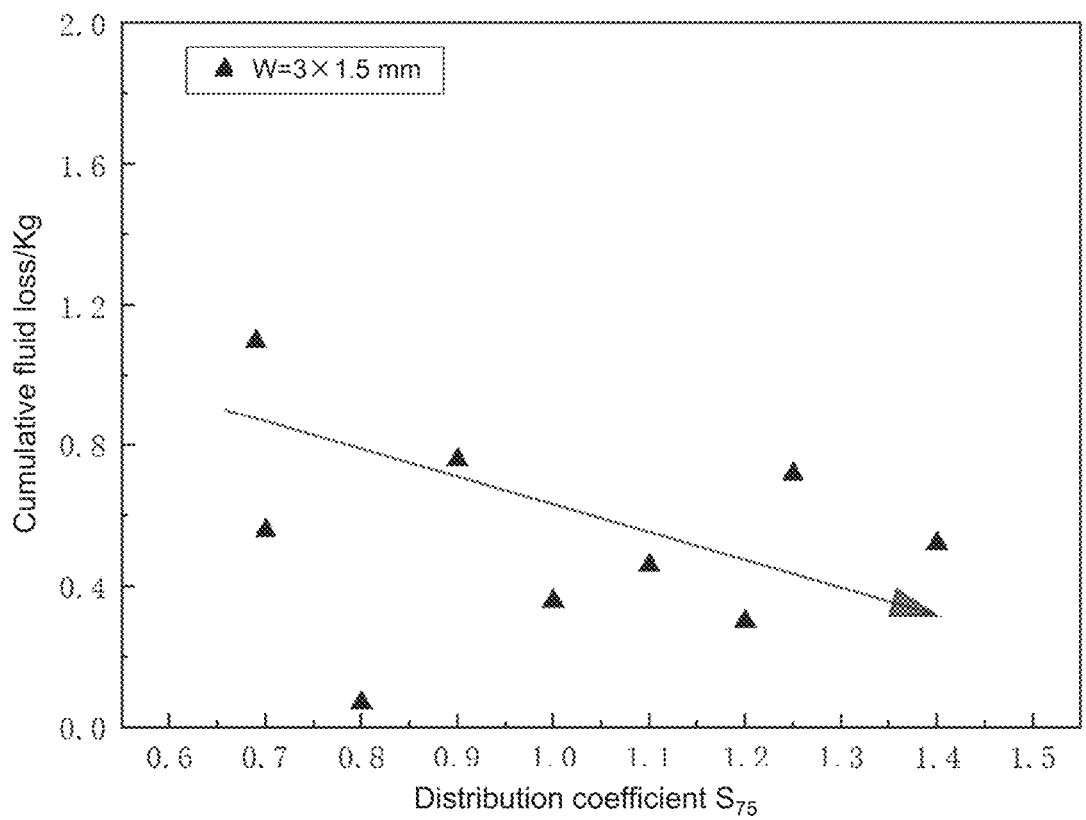
FIG. 13 is a schematic diagram illustrating results of a cumulative fluid loss under different particle size distribution coefficients $S_{75}$ of the embodiment of FIG. 9.

The horizontal coordinate of FIG. 10 represents the distribution coefficient $S_{90}$, and the vertical coordinate of FIG. 10 represents the pressure bearing capacity. The horizontal coordinate of FIG. 11 represents the distribution coefficient $S_{90}$, and the vertical coordinate of FIG. 11 represents the leakage. The horizontal coordinate of FIG. 12 represents the distribution coefficient $S_{75}$, and the vertical coordinate of FIG. 12 represents the pressure bearing capacity. The horizontal coordinate of FIG. 13 represents the distribution coefficient $S_{75}$, and the vertical coordinate of FIG. 13 represents the leakage.

From FIGS. 10-13, it can be seen that as the particle size distribution coefficients $S_{90}$ and $S_{75}$ increase, the pressure bearing capacity of the plugging zone tends to increase, and the cumulative fluid loss tends to decrease, and there is still a relatively large leakage when the particle size distribution coefficients $S_{90}$ and $S_{75}$ are relatively large. In this case, the critical value of the pressure bearing capacity of the plugging zone with the particle size distribution coefficient $S_{90}$ is 1.6, and the critical value of the particle size distribution coefficient $S_{75}$ is 1.

When the particle size distribution coefficient $S_{90}$ is less than 1.6, the stability of the plugging zone formed by the lost circulation material inside the fracture is poor, but the pressure bearing capacity of the plugging zone is still relatively large. In this case, the particle size distribution coefficient $S_{75}$ is 1 and 1.25, respectively. When the particle size distribution coefficient $S_{90}$ is greater than 1.6, the pressure bearing capacity of the plugging zone is greater than 12 MPa, and some of the pressure bearing capacity of the plugging zone reaches 17 MPa.

From the cumulative fluid loss corresponding to the particle size distribution coefficient $S_{90}$, it can be seen that with the increase of the particle size distribution coefficient $S_{90}$, the overall leakage tends to decrease, but the correlation between the leakage and the particle size distribution coefficient $S_{90}$ is relatively weak. When the distribution coefficient $S_{75}$ is less than 1, the pressure bearing capacity of the plugging zone is less than 12 MPa, and with the particle size distribution coefficient $S_{75}$ decreases, the pressure bearing capacity of the plugging zone decreases to be less than 8 MPa. In this case, there is a good value of pressure bearing capacity of the plugging zone, and the corresponding particle size distribution coefficient $S_{90}$ is 1.8. When the particle size distribution coefficient $S_{75}$ is greater than 1, the pressure bearing capacity of the plugging zone is significantly enhanced, the pressure bearing capacity is greater than 12 MPa, and the maximum pressure bearing capacity of 17 MPa does not cause damage and destabilization, realizing a good pressure bearing capacity of the plugging zone.

From the cumulative fluid loss corresponding to the particle size distribution coefficient $S_{75}$, it can be seen that with the increase of the particle size distribution coefficient $S_{75}$, the overall leakage tends to decrease. In this case, the correlation is relatively weak, and compact plugging occurs when the particle size distribution coefficient $S_{75}$ is relatively small.

In some embodiments, the optimization system 100 may study the correlation between the pressure bearing capacity of the plugging zone and the distribution coefficients $S_{75}$ and $S_{90}$, respectively using use correlation analysis, such as Pearson, Spearman, etc., to obtain a significant positive correlation between the pressure bearing capacity of the plugging zone and the distribution coefficients $S_{75}$ and $S_{90}$.

Combining the analysis of Table 5 and FIGS. 9-13, the optimization system 100 may determine the particle size distribution rule as $0.45 \leq R \leq 0.8$, $S_{90} \geq 1.6$, and $S_{75} \geq 1$ when the fracture width is 3 mm×1.5 mm.

In some embodiments, combining the two different particle size distribution rules described above, the optimization system 100 may determine the particle size distribution rule as $0.45 \leq R \leq 0.8$, $S_{90} \geq 1.6$, and $S_{75} \geq 1$.

The optimized particle size distribution data refers to a ratio of plugging particles of different particle sizes. In some embodiments, the optimization system 100 may obtain the optimized particle size distribution data by optimizing the particle size distribution of the lost circulation material based on the particle size distribution rule, calculating the target feature particle size $D_{90}$ based on the fracture width of the fracture mouth, and calculating the target feature particle size $D_{75}$ from the particle size distribution coefficient $S_{75}$ after determining the target feature particle sizes $D_{50}$ and $D_{25}$ from the particle size distribution coefficient $S_{90}$.

In some embodiments, a comparative evaluation experiment on the particle size distribution rule may be conducted by comparing the particle size distribution rule with an existing particle size distribution rule. The experimental base slurry, the fracture length, the wellbore temperature, the wellbore mixing rate, the pressurization mode, the pressurization rate, and other parameter settings are the same, the fracture width of the fracture mouth is 2 mm×1 mm, and the particle mass concentration is 7%. Merely by way of example, the target feature particle sizes obtained based on different rules are shown in Table 6:

TABLE 6

Different particle size distribution rules and feature particle sizes

| Particle size distribution rule | Content of rule | Particle feature size/mm | | | | |
|---|---|---|---|---|---|---|
| | | $D_{90}$ | $D_{75}$ | $D_{50}$ | $D_{25}$ | $D_{10}$ |
| Shielding and temporary blocking criterion | $7/10 W_{mean} \leq$ bridging particle $\leq W_{mean}$<br>$1/3 W_{mean} \leq$ filling particle $\leq 1/2 W_{mean}$ | 1.5 | 1.0 | 0.75 | 0.5 | 0.2 |
| $D_{90}$ criterion & Vickers criterion | $D_{90} = W_{max}$<br>$D_{75} < 2/3 W_{max}$<br>$D_{50} \geq 1/3 W_{mean}$<br>$D_{25} = 1/7 W_{mea}$<br>$D_{10} > W_{min}$ | 2.0 | 1.3 | 0.50 | 0.2 | 0.2 |
| Alsaba criterion | $D_{90} \geq 6/5 W_{max}$<br>$D_{50} \geq 3/10 W_{max}$ | 2.4 | 1.4 | 0.60 | 0.4 | 0.2 |
| Wang criterion | $0.5 \leq R \leq 0.7$<br>$S_p = (D_{90}-D_{10})/D_{50} \geq 1.5$<br>$D_{10} = 0.1$-$0.2$ mm | 1.4 | 1.0 | 0.80 | 0.4 | 0.2 |
| Kang criterion | $1/3 W_{max} \leq$ support material $\leq 4/5 W_{max}$<br>$1/5 W_{max} \leq$ filling particles $D_{90} \leq 1/3 W_{max}$ | 1.6 | 1.4 | 0.67 | 0.4 | 0.2 |

TABLE 6-continued

Different particle size distribution rules and feature particle sizes

| Particle size distribution rule | Content of rule | Particle feature size/mm | | | | |
|---|---|---|---|---|---|---|
| | | $D_{90}$ | $D_{75}$ | $D_{50}$ | $D_{25}$ | $D_{10}$ |
| Particle size distribution rule | $0.45 \leq R \leq 0.8$ $S_{90} \geq 1.6$ $S_{75} \geq 1$ | 1.6 | 1.2 | 0.75 | 0.4 | 0.2 |

The unit of the fracture width is denoted as mm, $W_{mean}$ denotes the average width of the fracture, $W_{max}$ denotes the fracture width of the fracture mouth, $W_{min}$ denotes the exit width of the fracture, and $S_p$ denotes the bandwidth of the particle size distribution of the plugging particles. The bridging particles refer to plugging particles used for bridging. The filling particles refer to plugging particles used for filling.

Figure 14:
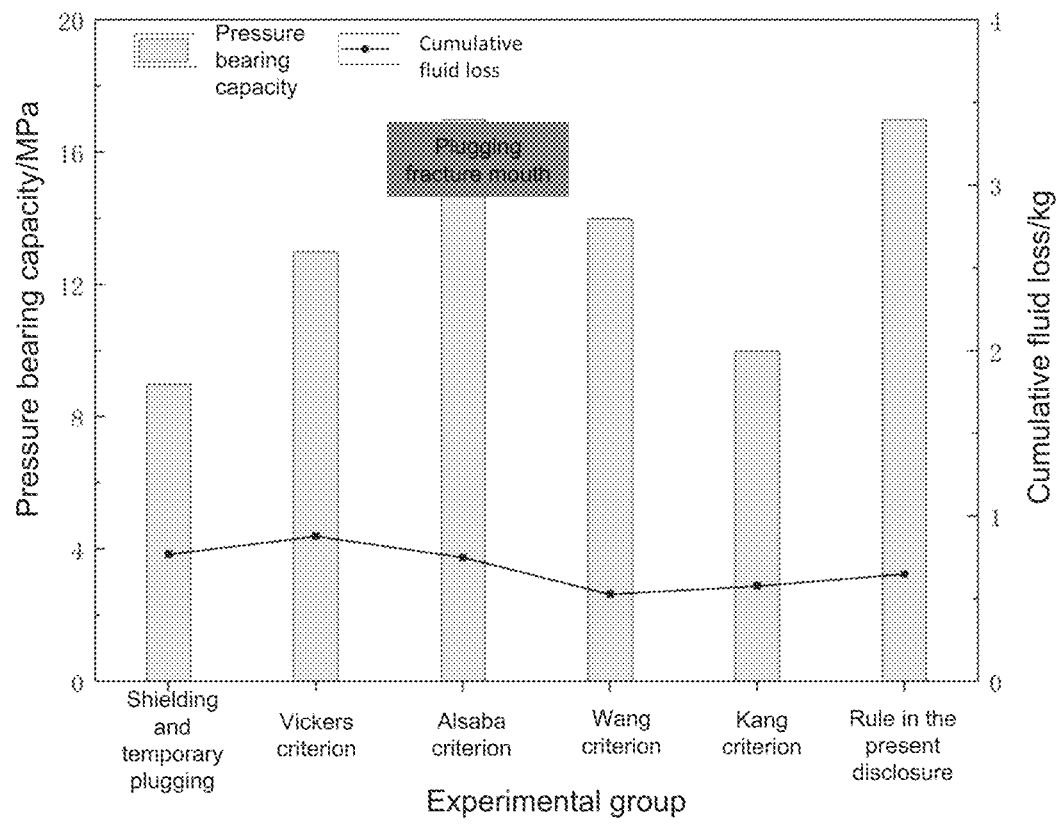
FIG. 14 is a schematic diagram illustrating experimental results under different particle size distribution rules according to some embodiments of the present disclosure.

The experimental results of different particle size distribution rules are shown in FIG. 14. The horizontal coordinate of FIG. 14 represents the experimental group, and the vertical coordinate of FIG. 14 represents the pressure bearing capacity and the leakage.

From Table 6 and FIG. 14, it can be seen that the shielding and temporary plugging criterion specifies the range of particle sizes of the bridging particles and the filling particles, but does not consider the situation when the distribution of the plugging particles is too concentrated. In addition, with the increase of the fracture width, the lower limit of the particle size of the filling particles is relatively high, the stability of the plugging zone formed in the process of fracture plugging is poor, and the pressure bearing capacity of the plugging zone is only 9 MPa.

The $D_{90}$ rule & Vicker criterion specify the feature particle sizes $D_{90}$, $D_{75}$, $D_{50}$, $D_{25}$, and $D_{10}$ of the plugging particles, which are proposed for pore-type leakage. However, the ratio of the bridging particles to the filling particles of the plugging particles is not sufficiently reasonable, which leads to the situation that the pressure bearing capacity of the plugging zone is weaker than the particle size ratio of the particle size distribution rule. Meanwhile, the feature particle size $D_{90}$ is equal to the width of the fracture mouth, which may lead to "plugging fracture mouth" of the plugging zone.

The Alsaba criterion is proposed for the fractured-type leakage, but preferred ranges are only proposed for the feature particle sizes $D_{90}$ and $D_{50}$ in the plugging particles, and the feature particle size $D_{90}$ is too large, which easily causes "plugging fracture mouth" of the plugging zone. In a fracture plugging simulation experiment, particles with the feature particle sizes between $D_{75}$ and $D_{90}$ are used as bridging particles, some of the particles enter the fracture and retain near the fracture mouth, and the remaining particles are deposited to retain at the fracture mouth, resulting in "plugging fracture mouth" phenomenon. Therefore, although the pressure bearing capacity of the plugging zone reaches 17 MPa, the plugging zone is extremely easy to be damaged during the process of plugging and pressure bearing in the fractured formation, resulting in repeated leakage of the drilling fluid.

The Wang criterion is close to the particle size distribution of the particle size distribution rule, but the Wang criterion does not clarify the particle size range of the feature particle size $D_{75}$. The stability of the plugging zone after the bridging of the plugging particles is not optimal, and the pressure bearing capacity of the plugging zone is still weaker than that of the rule in the present disclosure. The Kang criterion is similar to the shielding and temporary plugging criterion, which only gives the range of the particle size distribution of the support material and the filling particles, and does not specify the particle size distribution of the plugging particles, which results in the poor pressure bearing capacity of the plugging zone formed based on the ratio of the plugging particles, and destabilization occurs under the pressure of 10 MPa.

The plugging and filling module 150 may be configured to perform a plugging operation. In some embodiments, the plugging and filling module may be deployed near a drill pipe. In some embodiments, the plugging and filling module 150 may include at least one raw material reservoir of the lost circulation material, at least one pumping device, and a material control device.

The raw material reservoir of the lost circulation material refers to a raw material library that stores plugging particles of different particle sizes. One of the at least one raw material reservoir of the lost circulation material may store plugging particles of one particle size.

In some embodiments, raw material storage for lost circulation material and the drill pipe may be connected through the at least one pumping device. The at least one pumping device may be configured to pump the lost circulation material from the at least one raw material reservoir of the lost circulation material to a target location of the drill pipe based on a pumping parameter. The target location refers to a location where the fracture appears.

In some embodiments, one pumping device may correspond to one or more raw material storage for lost circulation materials.

The pumping parameter refers to a parameter associated with the lost circulation material pumped by the at least one pumping device. In some embodiments, the pumping parameter may include whether the at least one pumping device is on, and a frequency of pumping.

In some embodiments, pumping device can receive the pumping parameters sent by the material control device based on the communication module.

The material control device may be configured to obtain optimized particle size distribution data from a particle size distribution optimization module through the communication module; and in response to determining that a plugging instruction is obtained through the communication module, periodically update the pumping parameter.

The plugging instruction refers to an instruction used to instruct the material control device to start updating the pumping parameter.

In some embodiments, during each cycle, the material control device may query, based on second data under matching, second reference data in a preset parameter table that is the same as the second data under matching, and determine a pumping parameter corresponding to the second reference data as a pumping parameter within the current cycle. The second data under matching refers to a combination of the optimized particle size distribution data, a pumping parameter of a previous cycle, and current plugging time. The current plugging time refers to a time interval between the time when the material control device obtains the plugging instruction and the current time when the pumping parameter is updated.

In some embodiments, the preset parameter table may be preset based on historical data. The preset parameter table may include a plurality of second reference data and the pumping parameter corresponding to each of the plurality of second reference data. The plurality of second reference data refers to a set of historical particle size distribution data and historical pumping parameters and historical plugging time corresponding to the historical particle size distribution data. The historical particle size distribution data refers to the optimized particle size distribution data in the historical data. The historical pumping parameters refer to pumping parameters during one cycle in the historical data. The historical plugging time refers to the current plugging time in the historical data. The pumping parameter corresponding to each of the plurality of reference data refers to a pumping parameter of the next cycle of the cycle corresponding to the historical pumping parameters.

In some embodiments, the material control device may send the pumping parameter to the at least one pumping device to control the at least one pumping device to perform the pumping operation based on the pumping parameter.

According to some embodiments of the present disclosure, by optimizing the interaction and collaboration of the modules in the system, the particle size distribution rule with better fracture plugging effect can be obtained, which in turn reduces the cumulative fluid loss, and effectively improves the pressure bearing capacity of the plugging zone.

It should be understood that the system and the modules thereof shown in FIG. 1 may be realized in various ways. It should be noted that the above description of the system for optimizing the particle size distribution of the lost circulation material and the modules thereof is only for the convenience of the description, and it does not limit the present disclosure to the scope of the embodiments cited. It is understood that for a person skilled in the art, after understanding the principle of the system, it may be possible to arbitrarily combine individual modules or form a subsystem to connect with other modules without departing from this principle.

Figure 15:
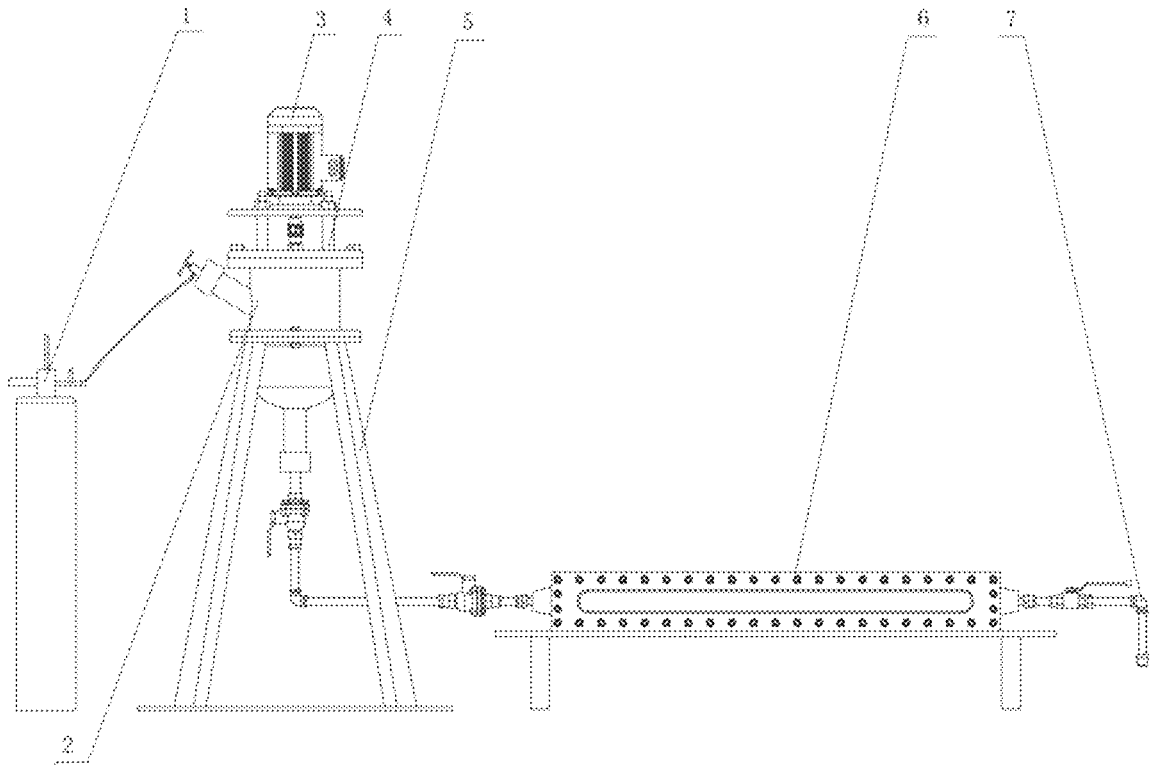
FIG. 15 is a schematic structural diagram illustrating an exemplary visual experimental device according to some embodiments of the present disclosure.
Figure 16:
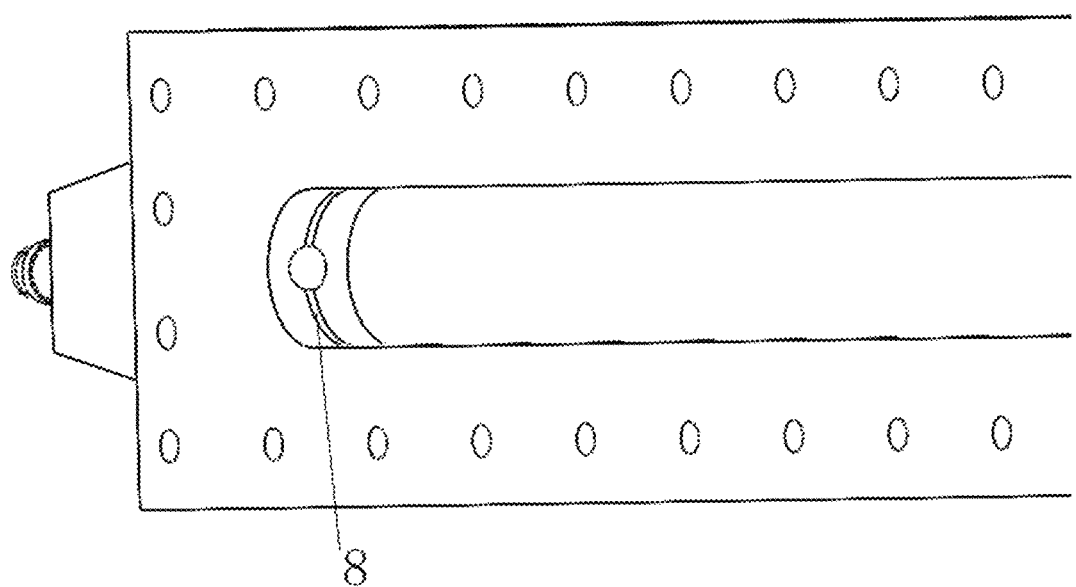
FIG. 16 is a schematic diagram illustrating a partial structure of a visual fracture plate device according to some embodiments of the present disclosure.

FIG. 15 is a schematic structural diagram illustrating an exemplary visual experimental device according to some embodiments of the present disclosure. FIG. 16 is a schematic diagram illustrating a partial structure of a visual fracture plate device according to some embodiments of the present disclosure.

In some embodiments, the optimization system 100 may conduct fracture plugging experiments based on a plurality of experimental schemes using a visual experimental device to obtain experimental results. More descriptions regarding the experimental schemes, the fracture plugging experiments, and the experimental results may be found in FIG. 1 and related descriptions thereof.

In some embodiments, as shown in FIGS. 15-16, the visual experimental device may include a temperature and pressure regulation device, a wellbore simulation device, a visual fracture plate device 6, and a leakage fluid collection device 7 connected in sequence.

The temperature and pressure regulation device may be configured to regulate temperature and pressure of the wellbore simulation device based on a first parameter. The first parameter refers to a parameter for instructing to regulate the temperature and the pressure of the wellbore simulation device. In some embodiments, the first parameter may be reset based on practical needs.

In some embodiments, the temperature and pressure regulation device may include a pressurization device 1 and a heating device connected with the wellbore simulation device, respectively, as shown in FIG. 15.

In some embodiments, in response to determining that a fracture plugging effect corresponding to the first parameter does not satisfy a preset regulation condition, the optimization system may determine a second parameter based on pressure detection data and drilling fluid flow data corresponding to the first parameter.

The second parameter refers to an optimized first parameter.

The preset regulation condition refers to a condition used to determine whether the second parameter needs to be determined.

In some embodiments, the fracture plugging effect may be expressed by a numerical value or the like. The larger the value, the better the fracture plugging effect. In some embodiments, the preset regulation condition may include that the fracture plugging effect is not lower than an effect threshold. The effect threshold may be preset based on historical experience.

In some embodiments, the optimization system may determine the second parameter based on the pressure detection data and the drilling fluid flow data corresponding to the first parameter. For example, the optimization system may construct a third vector under matching from the first parameter, the pressure detection data, and the drilling fluid flow data, and perform vector similarity calculation with the third reference vector, and determine a label corresponding to the third reference vector with the highest similarity as the second parameter. The similarity of the vectors may be negatively correlated with a distance between the vectors. The distance between the vectors may be a cosine distance, or the like.

In some embodiments, the optimization system may take a plurality of fracture plugging experiments with fracture plugging effects greater than the effect threshold in the historical data as sample data, construct a plurality of clustering vectors based on the fracture plugging effects, the pressure detection data, the drilling fluid flow data, and the first parameter of the sample data, form a preset count of clustering centers by clustering based on the plurality of clustering vectors, construct a third reference vector based on the first parameter, the pressure detection data, and the drilling fluid flow data corresponding to the plurality of clustering centers, and use an actual second parameter of the sample data as a label of the third reference vector. The actual second parameter of the sample data may be determined based on manual labeling.

According to some embodiments of the present disclosure, if the fracture plugging effect after the fracture plugging experiment is performed based on the first parameter does not satisfy the preset regulation condition, the optimization system may regulate the first parameter in time to ensure the effectiveness of the fracture plugging experiment.

The wellbore simulation device may be configured to simulate well drilling during actual construction. In some embodiments, the wellbore simulation device as shown in FIG. 15 may include a wellbore body 2, an agitation device 3, a wellbore cover 4, and a fixing bracket 5 for supporting the wellbore body 2. The wellbore cover 4 may be removably provided on a top of the wellbore body 2 through bolts.

The visual fracture plate device may be configured to simulate a fracture in actual construction. In some embodiments, a fracture inlet and/or a fracture outlet of the visual fracture plate device may be provided with a notch 8, as shown in FIG. 16.

The leakage fluid collection device may be configured to collect leakage plugging slurry. The plugging slurry refers to slurry formed by melting of the plugging particles.

In some embodiments, the visual experimental device may further include a pressure detection device. The pressure detection device may be configured to obtain the pressure detection data.

The pressure detection data refers to data related to the pressure of the plugging zone. In some embodiments, the pressure detection data may include sequential data of a pressure difference between two ends of the plugging zone over a preset time period. The sequential data of the pressure difference between the two ends of the plugging zone may include the pressure difference between the two ends of each of the plurality of plugging zones. The preset time period may be preset based on historical experience.

In some embodiments, the visual experimental device may further include a fluid metering device. The fluid metering device may be configured to obtain the drilling fluid flow data.

The drilling fluid flow data refers to data related to the cumulative fluid loss. In some embodiments, the drilling fluid flow data may include sequential data of the cumulative fluid loss during the preset time period. The sequential data of the cumulative fluid loss may include a plurality of cumulative fluid loss.

In some embodiments, the visual experimental device may further include a camera device. The camera device may be configured to capture an experimental image.

The experimental image refers to an image associated with the fracture plugging experiment. In some embodiments, the experimental image may include an image of a process of the lost circulation material forming the plugging zone and pressure bearing and plugging of the plugging zone.

In some embodiments, the camera device may capture the experimental image at a preset acquisition frequency. The preset acquisition frequency may be preset based on the historical experience. For example, the preset acquisition frequency may be one shot per second.

In some embodiments, the visual experimental device may further include a camera regulation component.

The camera regulation component may be configured to dynamically regulate the acquisition frequency of the camera device.

In some embodiments, the camera regulation component may dynamically regulate the acquisition frequency of the camera device in various ways based on a current experimental stage. For example, the camera regulation component may query, based on the current experimental stage, a reference experimental stage in a preset frequency table that is the same as the current experimental stage, and determine a standard acquisition frequency corresponding to the reference experimental stage as the acquisition frequency of the camera device within the current experimental stage. The experimental stage refers to a time period during which the fracture plugging experiment is conducted. In some embodiments, the optimization system may divide the fracture plugging experiment into a plurality of experimental stages based on a preset duration. The preset duration may be preset based on the historical experience.

In some embodiments, the preset frequency table may be preset based on the historical experience. The preset frequency table may include a plurality of reference experimental stages and the standard acquisition frequency corresponding to each of the plurality of reference experimental stage. The plurality of reference experimental stages may be the same as the experimental stages. The optimization system may select a plurality of fracture plugging experiments in the historical data of which the fracture plugging effect is greater than the effect threshold, and determine an acquisition frequency with the highest count of acquisition within each of the plurality of reference experimental stages corresponding to the plurality of fracture plugging experiments as the standard acquisition frequency corresponding to the reference experimental stage.

In some embodiments, the camera regulation component may predict destabilization time based on at least one frame of experimental image and the current experimental stage, and determine the acquisition frequency based on the destabilization time.

The destabilization time refers to time when the pressure difference between the two ends of the plugging zone is too low. In some embodiments, the optimization system may determine time when the pressure difference between the two ends of the plugging zone is less than a pressure difference threshold as the destabilization time.

In some embodiments, the pressure difference threshold may be preset based on the historical experience. The pressure difference threshold may be less than the first threshold. More descriptions regarding the first threshold may be found in FIG. 1 and related descriptions thereof.

In some embodiments, the optimization system may predict the destabilization time in various ways based on the at least one frame of experimental image and the current experimental stage. For example, the optimization system may match the at least one frame of experimental image of the current experimental stage with sample images, select a sample image that satisfies a preset matching condition with the experimental image, and determine actual destabilization time corresponding to the sample image as the destabilization time. The preset matching condition may include that the similarity is the highest similarity. The optimization system may determine the similarity between the experimental image and the sample image through an image recognition algorithm, etc.

The sample image refers to an experimental image of the same experimental stage as the current experimental stage from historical fracture plugging experiments. The actual destabilization time corresponding to the sample image may be determined based on the historical data.

In some embodiments, the optimization system may predict the destabilization time through a destabilization prediction model based on a third parameter, the pressure detection data, the drilling fluid flow data, the current experimental stage, and the at least one frame of experimental image. More descriptions may be found in FIG. 19 and related descriptions thereof.

In some embodiments, a sampling frequency may be correlated with a difference between the destabilization time and the current time, and a preset sampling frequency. Merely by way of example, the optimization system may determine the sampling frequency by the following equation (5):

$$P2 = 1/(|T1-T2|+a) + P1 \qquad (5)$$

wherein P2 denotes the sampling frequency, T1 denotes the destabilization time, T2 denotes the current time, P1 denotes the preset sampling frequency, and a denotes a preset constant. a is used to avoid a denominator of 0. a may be preset based on the historical experience.

In some embodiments of the present disclosure, by obtaining the destabilization time and determining the acquisition frequency based on the destabilization time, a more frequent sampling frequency can be determined in a time period closer to the destabilization time, so as to obtain more experimental images prior to the destabilization time, thereby improving the accuracy of determining the fracture plugging effect.

In a specific embodiment, the optimization system may conduct a fracture plugging experiment based on a plurality of experimental schemes using a visual experimental device. The fracture plugging experiment may include the following operations:

S1: the visual fracture plate device 6 may be installed at the exit of the wellbore simulation device and the plugging base slurry with the plugging particles may be loaded into the wellbore body 2, the plugging base slurry being slurry formed by melting of the plugging particles;

S2: the plugging slurry in the wellbore body 2 may keep stirring at a uniform speed to slow down the settling speed of coarse particles, a pipeline valve may be opened, and an initial pressure of 0.1 MPa may be applied to a kettle body through the temperature and pressure regulation device;

S3: after successful plugging, the simulated wellbore pressure at the fracture mouth end may be increased successively with a pressure increment of 0.5 MPa, and the experiment may be ended if the plugging zone is damaged during the period;

S4: during the operations (2)-(3), the camera device may keep stable and perpendicular to the fracture surface to acquire image of the plugging zone at the acquisition frequency until the plugging zone is damaged; and S5: the images of the plugging zone during the pressure bearing process of the plugging zone may be analyzed using a digital image correlation method to obtain force features of the plugging particles inside the plugging zone and force features of the plugging zone during a pressure destabilization process.

The experimental results of the experimental schemes may be shown in Table 7:

TABLE 7

Experimental results

| | Particle feature size/mm | | | | | |
|---|---|---|---|---|---|---|
| No. | $D_{90}$ | $D_{75}$ | $D_{50}$ | $D_{25}$ | $D_{10}$ | Plugging or not |
| C1 | 2.40 | 1.34 | 1.06 | 0.50 | 0.10 | Form the plugging zone |
| C2 | 2.10 | 1.68 | 1.06 | 0.40 | 0.10 | Form the plugging zone |
| C3 | 2.10 | 1.46 | 1.06 | 0.40 | 0.10 | Form the plugging zone |
| C4 | 1.80 | 1.10 | 0.88 | 0.40 | 0.10 | Form the plugging zone |
| C5 | 1.50 | 1.33 | 0.86 | 0.30 | 0.10 | Form the plugging zone |

After the plugging particles of the experimental groups C2 and C3 form a stable plugging zone within the fracture, the plugging zone presents single-particle bridging of the plugging particles, and the front section of the plugging zone is compactly blocked by the plugging particles with smaller particle size. Since the particle size distribution is not reasonable enough, the pressure bearing capacity of the plugging zone is insufficient, and shear destabilization occurs under the action of the pressure difference. The overall particle size of the plugging particles in the experimental group C5 is small, and after the plugging zone is formed, it can be observed that the bridging mode of the plugging zone is in multi-particle bridging.

Figure 17:
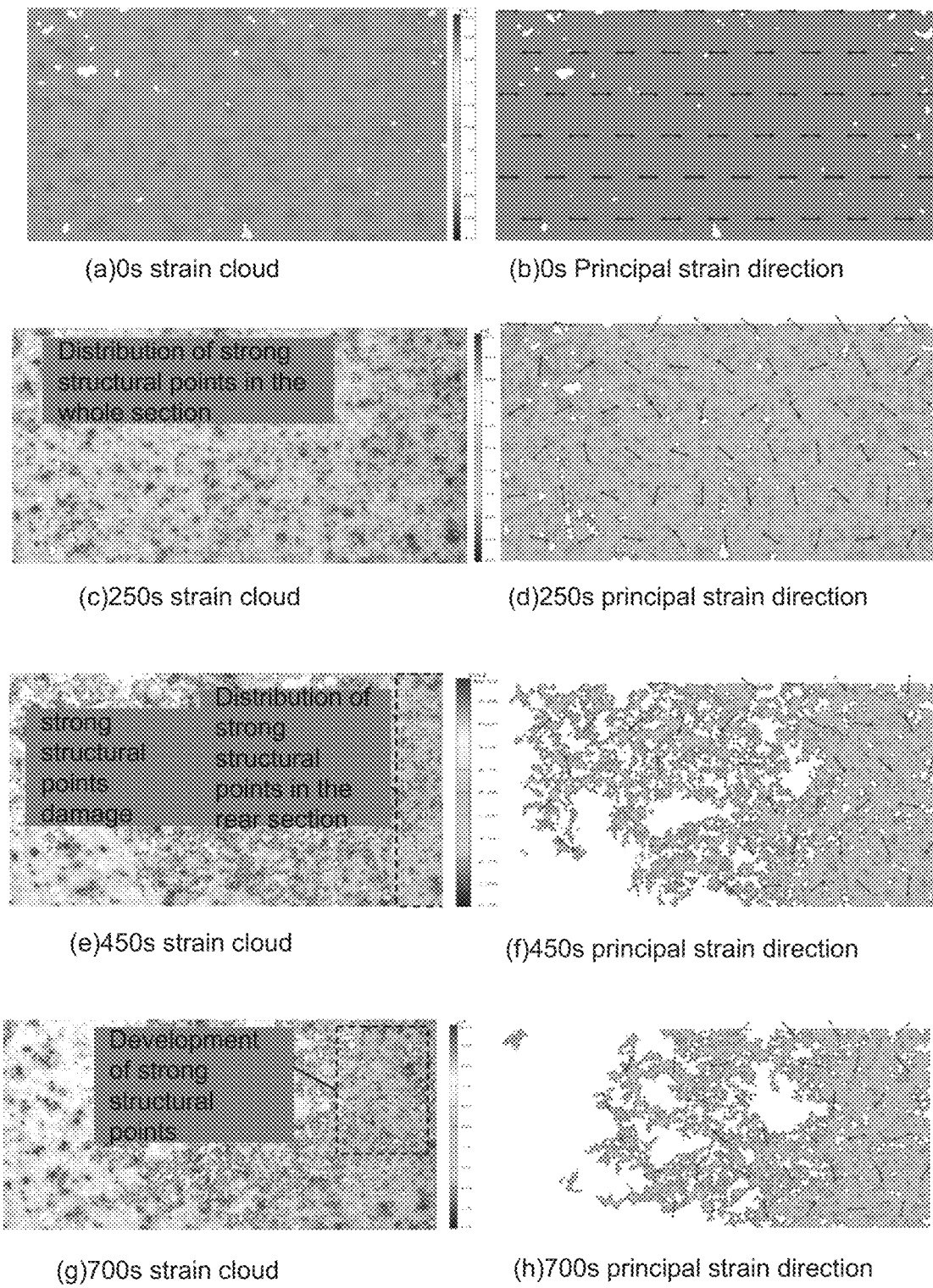
FIG. 17 is a schematic diagram illustrating a strain cloud and a principal strain direction of a plugging zone in case of leakage loss.

After the plugging particles form the plugging zone, a strain cloud and a principal strain direction of the plugging zone in case of the leakage are shown in FIG. 17. The legend in the strain cloud is within a range of 0%-10%. It can be seen from FIG. 17 that the process from the formation of the plugging zone by the plugging particles until the leakage is divided into three stages, i.e. (1) the stable pressure bearing stage of the plugging zone, as shown in FIG. 17(a)-(d); (2) the pressure penetration stage of the plugging zone, as shown FIG. 17(e)-(h); and (3) the leakage stage of the plugging zone, as shown FIG. 17(i)-(j).

Strain analysis of the image of the plugging zone shows that the strong stable structural points within the plugging zone in FIG. 17(c) are distributed throughout the entire section, forming a strong chain network structure.

In FIG. 17(d), the principal strain direction is disordered, then the plugging zone can realize stable pressure bearing. As the simulated wellbore pressure increases, the pressure difference between the two ends of the plugging zone increases, and the plugging particles used for plugging in the front section of the plugging zone move to the middle section of the plugging zone under the pressure, resulting in the communication of the pores in the front section of the plugging zone, as shown in FIG. 17(e). The strain cloud of the front section of the plugging zone produces vacancies, and the high strain points in the middle section of the plugging zone increase, indicating that the structural stability of the middle section of the plugging zone deteriorates, and the strong chain structure still exists in the rear section of the plugging zone.

It is shown in FIG. 17(f) that the vacancies develop along the principal strain direction, i.e., the structural damage of the plugging zone develops from the front section to the middle and upper middle section of the plugging zone. The simulated wellbore pressure continues to increase, the plugging particles used for plugging in the middle section of the plugging zone are also subjected to destabilization to move to the rear section of the plugging zone, and the inter-particle pores of the bridging particles in the front and middle sections of the plugging zone are communicated to form a leakage throat, as shown in FIG. 17(g)-(h).

FIG. 17(i) illustrates that although the strong chain structure in the rear section of the plugging zone is not damaged, the weak structural points are communicated and the vacancies continue to increase, i.e., the pressure propagates through the leakage throat in the front and middle sections to the rear section, resulting in a pressure rise in the rear section of the plugging zone. The structure of the bridging particles in the rear section of the plugging zone is stable, but the filling particles for plugging are lost to the exit of the fracture under the effect of the pressure difference. In this case, the inter-granular pores of the bridging particles in the front, middle and rear sections of the plugging zone are communicated to form a leakage channel. The plugging particles cannot retain in the leakage channel, resulting in continuous leakage of the drilling fluid, and leakage destabilization of the plugging zone.

According to some embodiments of the present disclosure, the fracture plugging experiments are conducted using the visual experimental device, which can effectively simulate the process of plugging, pressure bearing, and destabilization of the lost circulation material, thereby providing technical support for well drilling and leakage plugging.

FIG. 18 is a flowchart illustrating an exemplary predicted fracture plugging effect according to some embodiments of the present disclosure. In some embodiments, a process 1800 may be performed by an optimization system. As shown in FIG. 18, the process 1800 may include the following operations.

In 1810, a data validity may be determined based on an experimental image, pressure detection data, and drilling fluid flow data. More descriptions regarding the experimental image, the pressure detection data, and the drilling fluid flow data may be found in FIG. 15 and related descriptions thereof.

The data validity is used to characterize the degree of validity of the pressure detection data and the drilling fluid flow data. In some embodiments, the data validity may be expressed by a numerical value, or the like. The larger the numerical value, the higher the validity of the pressure detection data and the drilling fluid flow data.

In some embodiments, the optimization system may determine the data validity based on the experimental image, the pressure detection data, and the drilling fluid flow data. For example, the optimization system may match the experimental image with reference images in a sample database, select a reference image in the sample database that satisfies a preset matching condition, construct a fourth vector under matching from the pressure detection data and the drilling fluid flow data, calculate the similarity between a standard vector corresponding to the reference image and the fourth vector under matching, and determine the similarity as the data validity.

In some embodiments, the sample database may be preset based on historical experience. The sample database may include a plurality of reference images and the standard vector corresponding to each of the plurality of reference images. The plurality of reference images refer to experimental images of historical fracture plugging experiments. The standard vector corresponding to each of the plurality of reference images refers to a vector constructed from the pressure detection data and the drilling fluid flow data of the historical fracture plugging experiment corresponding to each of the plurality of reference images In some embodiments, the pressure detection data and the drilling fluid flow data of the historical fracture plugging experiments may be determined through multiple acquisitions and/or multiple parties. Determining through multiple acquisitions may include acquiring data multiple times during a preset collection time. Determining through multiple parties refers to acquiring at a preset time point using a plurality of pressure measuring devices and/or fluid metering devices. The preset acquisition time and the preset time point may be preset based on the historical experience.

In some embodiments, the optimization system may calculate a standard deviation and a mean value of the pressure detection data and the drilling fluid flow data obtained by determining through multiple acquisitions and/or multiple parties, and calculate a ratio of the standard deviation to the mean value to obtain a fluctuation value. If the fluctuation value is less than an error threshold, the optimization system may construct a standard vector based on the mean value of the pressure detection data and the drilling fluid flow data, and add the standard vector and an experimental image of the historical fracture plugging experiment corresponding to the standard vector to the sample database.

In 1820, in response to determining that the data validity does not satisfy a preset condition, a plurality of fracture plugging experiments may be restarted to obtain experimental results.

The preset condition refers to a condition for determining whether to restart the plurality of fracture plugging experiments. In some embodiments, the preset condition may include that the data validity is not less than a validity threshold. The validity threshold may be preset based on the historical experience.

In some embodiments, in response to determining that the data validity does not satisfy the preset condition, the optimization system may restart the plurality of fracture plugging experiments and obtain the experimental results.

In 1830, in response to determining that the data validity satisfies the preset condition, a fracture plugging effect in a future time period corresponding to each of the plurality of experimental schemes may be predicted based on a first parameter corresponding to each of the plurality of experimental schemes, the pressure detection data, and the drilling fluid flow data.

In some embodiments, in response to determining that the data validity satisfy the preset condition, the optimization system may predict, based on the first parameter corresponding to each of the plurality of experimental schemes, the pressure detection data, and the drilling fluid flow data, the fracture plugging effect in the future time period corresponding to each of the plurality of experimental schemes through the method of predicting the fracture plugging effect described in FIG. 1.

In some embodiments of the present disclosure, by determining the data validity of the pressure detection data and the drilling fluid flow data, whether to restart the plurality of fracture plugging experiments can be determined, and thus the pressure detection data and the drilling fluid flow data that have a high validity can be obtained, thereby improving the accuracy of predicting the fracture plugging effect.

It should be noted that the foregoing description of the process 1800 is intended to be exemplary and illustrative only and does not limit the scope of application of the present disclosure. For those skilled in the art, various corrections and changes to the process may be made under the guidance of the present disclosure. However, such corrections and changes remain within the scope of the present disclosure.

Figure 19:
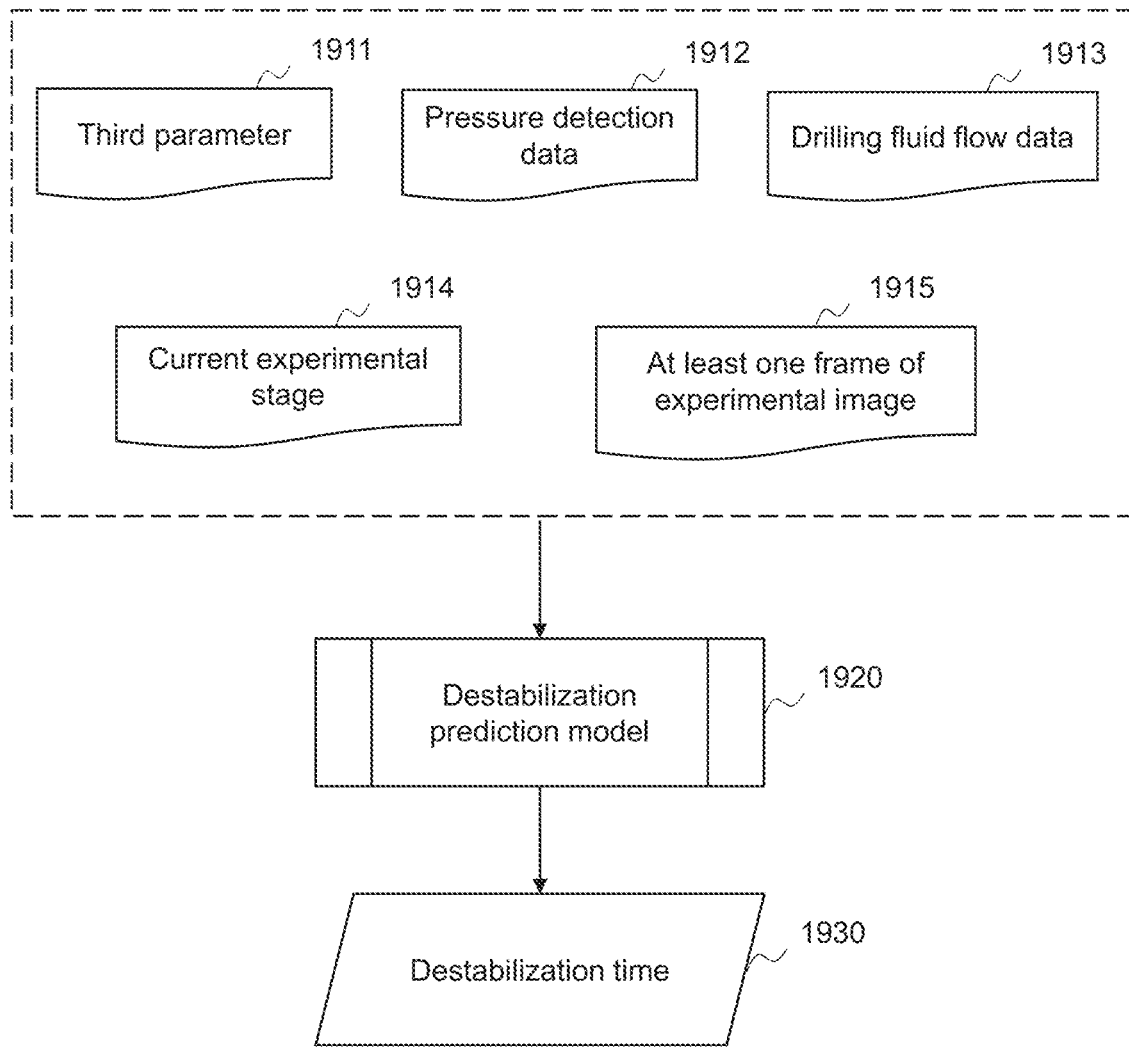
FIG. 19 a schematic diagram illustrating an exemplary destabilization prediction model according to some embodiments of the present disclosure.

FIG. 19 a schematic diagram illustrating an exemplary destabilization prediction model according to some embodiments of the present disclosure.

In some embodiments, an optimization system may predict, based on a third parameter 1911, pressure detection data 1912, drilling fluid flow data 1913, a current experimental stage 1914, and at least one frame of experimental image 1915, destabilization time 1930 through a destabilization prediction model 1920. More descriptions regarding the pressure detection data, the drilling fluid flow data, the current experimental stage, and the at least one frame of experimental image may be found in FIG. 15 and related descriptions thereof.

The third parameter refers to a current operating parameter of a temperature and pressure regulation device. The third parameter may be a first parameter or a second parameter.

The destabilization prediction model refers to a model for predicting the destabilization time. In some embodiments, the destabilization prediction model may be a machine learning model. For example, the destabilization prediction model may include any one of a graph neural network (GNN) model, a neural networks (NN) model, or other customized model structures, or the like, or any combination thereof.

In some embodiments, the optimization system may train the destabilization prediction model based on a first training set through gradient descent, etc. The first training set may include a large number of first training samples with first labels. The first training samples may include a sample third parameter, sample pressure detection data, sample drilling fluid flow data, a sample experimental stage, and a sample experimental image. The first labels of the first training samples may include actual destabilization time. In some embodiments, the first training samples may be obtained based on historical data, and the first labels may be determined based on manual labeling.

In some embodiments, the training of the destabilization prediction model may include a first stage of training. The first stage of training may include training an initial destabilization prediction model based on the first training set, verifying an output result of the initial destabilization prediction model based on a first verification set, and testing the obtained destabilization prediction model based on a first test set.

The first training set may be used for the initial destabilization prediction model. The first verification set may be used to regulate a hyperparameter for a trained initial destabilization prediction model. The first test set may be used to test the generalizability of the destabilization prediction model. The hyperparameter refers to a parameter set before the training of the initial destabilization prediction model. The hyperparameter may not change during the training.

The manner of constructing the first verification set and the first test set may be similar to the manner of constructing the first training set, which may be found in the manner of constructing the first training set.

In some embodiments, data volumes of the first training set, the first test set, and the first verification set may constitute a first preset ratio without data cross. The first preset ratio may be preset based on historical experience. For example, a ratio of the data volumes the first training set, the first test set, and the first verification set may be 8:1:1.

The data cross means that a set of sample third parameters, sample pressure detection data, sample drilling fluid flow data, sample experimental stages, and sample experimental images are present in at least two of the training set, the test set, and the verification set.

In some embodiments, a sample statistical difference of the first training set may be greater than a preset difference threshold.

The sample statistical difference may be used to characterize the sample diversity of the first training sample in the first training set. The greater the sample diversity, the greater the sample statistical difference.

In some embodiments, the optimization system may quantify the data in each of the plurality of first training samples into a plurality of numerical values through standardization, or the like, and construct first numerical vectors corresponding to the plurality of first training samples based on the plurality of numerical values. The optimization system may calculate vector distances between the plurality of first numerical vectors to obtain a plurality of vector distances, calculate a variance of the plurality of vector distances, and determine the sample statistical difference based on a correspondence between the variance and the sample statistical difference. The vector distances may include a cosine distance, or the like. The correspondence between the variance and the sample statistical difference may include that the sample statistical difference is positively correlated with the variance.

In some embodiments, the preset difference threshold may be determined based on the fluctuation in the destabilization time in the historical data. The greater the fluctuation in the destabilization time in the historical data, the greater the preset difference threshold.

It is understood that the greater the fluctuation in the destabilization time in the historical data, the more uncertain the trend of the destabilization time and the more potential impacts are involved. Therefore, by increasing the preset difference threshold, the destabilization prediction model is enabled to learn from more widely distributed data samples, thereby improving the prediction accuracy.

According to some embodiments of the present disclosure, the destabilization prediction model is trained, tested, and verified by the first training set, the first test set, and the first verification set, such that the destabilization prediction model with higher generalizability and more accurate output can be obtained. Meanwhile, the sample statistical difference of the first training set is greater than the preset difference threshold, which can make the destabilization prediction model more robust, avoiding overfitting of the destabilization prediction model.

In some embodiments, the optimization system may also predict the destabilization time based on the third parameter, the pressure detection data, the drilling fluid flow data, the current experimental stage, and the at least one frame of experimental image.

For example, the optimization system may match the experimental image with reference images in the sample database, select a reference image in the sample database that satisfies a preset matching condition, construct a fifth vector under matching from the third parameter, the pressure detection data, the drilling fluid flow data, and the current experimental stage, calculate the similarity between standard vectors corresponding to the reference images and the fifth vector under matching, and determine actual destabilization time corresponding to a standard vector with the highest similarity as the destabilization time.

In this case, the standard vectors corresponding to the reference images may also include the third parameters of the historical fracture plugging experiments corresponding to the reference images and the current experimental stage. The sample database may also include the actual destabilization time corresponding to the standard vector. More descriptions regarding the sample database may be found in FIG. 18 and related descriptions thereof.

According to some embodiments of the present disclosure, when the destabilization time is determined, the more accurate destabilization time can be determined by considering the effects of the third parameter, the pressure detection data, the drilling fluid flow data, and the current experimental stage on the destabilization time.

According to some embodiments of the present disclosure, the third parameter, the pressure detection data, the drilling fluid flow data, the current experimental stage, and the at least one frame of experimental image may be processed by the destabilization prediction model, which can find patterns from a large amount of data using the self-learning capability of the machine learning model, thereby improving the accuracy and efficiency of predicting the destabilization time.

In addition, certain features, structures, or characteristics of one or more embodiments of the present disclosure may be suitably combined.

In some embodiments, numbers describing the number of ingredients and attributes are used. It should be understood that such numbers used for the description of the embodiments use the modifier "about", "approximately", or "substantially" in some examples. Unless otherwise stated, "about", "approximately", or "substantially" indicates that the number is allowed to vary by ±20%. Correspondingly, in some embodiments, the numerical parameters used in the description and claims are approximate values, and the approximate values may be changed according to the required features of individual embodiments. In some embodiments, the numerical parameters should consider the prescribed effective digits and adopt the method of general digit retention. Although the numerical ranges and parameters used to confirm the breadth of the range in some embodiments of the present disclosure are approximate values, in specific embodiments, settings of such numerical values are as accurate as possible within a feasible range.

In the event of any inconsistency or conflict between the descriptions, definitions, and/or use of terminology in the materials cited in the present disclosure and those presented in the present disclosure, the descriptions, definitions, and/or use of terminology in the present disclosure shall prevail.

What is claimed is:

1. A method for optimizing a particle size distribution of a lost circulation material, comprising:
    obtaining a first feature particle size of a plugging particle affecting a particle bridging plugging position, a second feature particle size of a plugging particle affecting an inter-particle force and a force between the particle and a fracture wall, and a third feature particle size of a plugging particle affecting a compactness of a plugging zone, wherein the first feature particle size of the plugging particle includes $D_{90}$, the second feature particle size of the plugging particle includes $D_{90}$, $D_{75}$, and $D_{50}$, and the third feature particle size of the plugging particle includes $D_{25}$ and $D_{10}$;
    setting a plurality of experimental schemes for fracture plugging based on the first feature particle size of the plugging particle, the second feature particle size of the plugging particle, and the third feature particle size of the plugging particle, wherein the plurality of experimental schemes are determined based on a principle of compact particle packing, and set parameters include a maximum particle size $D_L$, a minimum particle size $D_S$, and the feature particle size of the plugging particle;
    conducting fracture plugging simulation experiments based on the plurality of experimental schemes under different fracture width conditions to obtain simulation experimental results of fracture plugging; and
    evaluating, based on the simulation experimental results of fracture plugging, a plurality of fracture plugging effects of each of the plurality of experimental schemes under different fracture width conditions;
    determining a particle size distribution rule based on the plurality of fracture plugging effects of each of the plurality of experimental schemes under different fracture width conditions; the particle size distribution rule including a particle fracture ratio and a particle size distribution coefficient, and the particle size distribution coefficient including a particle size distribution coefficient of a core bridging particle and a particle size distribution coefficient of a secondary bridging particle, the particle fracture ratio being calculated by the following equation:

$$R = D_{90}/W_{in} \tag{1}$$

wherein R denotes the particle fracture ratio, $D_{90}$ denotes to a feature particle size in mm when a cumulative particular size distribution of the plugging particles reaches 90%, and $W_{in}$ denotes the opening of the fracture mouth in mm;
    the particle size distribution coefficient being calculated by the following equation:

$$S_{90} = (D_{90} - D_{25})/(D_{50}) \tag{2}$$

$$S_{75} = (D_{75} - D_{25})/(D_{50}) \tag{3}$$

wherein $S_{90}$ denotes the particle size distribution coefficient of the core bridging particles; $D_{90}$ denotes to a feature particle size in mm when a cumulative particular size distribution of the plugging particles reaches 90%; $D_{75}$ denotes to a feature particle size in mm when the cumulative particular size distribution of the plugging particles is 75%; $D_{50}$ denotes to a feature particle size in mm when the cumulative particular size distribution of the plugging particles is 50%; $D_{25}$ denotes to a feature particle size in mm when the cumulative particular size distribution of the plugging particles is 25%; and $S_{75}$ denotes the particle size distribution coefficient of the secondary bridging particles; and
    optimizing the particle size distribution of the lost circulation material according to the particle size distribution rule.

2. The method of claim 1, wherein the plurality of fracture plugging effects are characterized by a pressure bearing capacity of the plugging zone and a cumulative fluid loss;
    when a pressure difference between two ends of the plugging zone is less than 8 MPa, the pressure bearing capacity of the plugging zone is poor;
    when the pressure difference between the two ends of the plugging zone is greater than or equal to 8 MPa and less than 12 MPa, the pressure bearing capacity of the plugging zone is moderate;
    when the pressure difference between the two ends of the plugging zone is greater than or equal to 12 MPa and less than 16 MPa, the pressure bearing capacity of the plugging zone is moderate to good; and
    when the pressure difference between the two ends of the plugging zone is greater than or equal to 16 MPa, the pressure bearing capacity of the plugging zone is good;
    wherein the less the cumulative fluid loss, the higher the pressure bearing capacity of the plugging zone, and the better the fracture plugging effect.

3. The method of claim 1, wherein the particle size distribution rule includes that the particle fracture ratio is greater than or equal to 0.45 and less than or equal to 0.8, the particle size distribution coefficient of the core bridging particle is greater than or equal to 1.6, and the particle size distribution coefficient of the secondary bridging particle is greater than or equal to 1.

4. The method of claim 1, wherein when the fracture width condition is 2.5 mm×1 mm, the particle size distribution rule includes that the particle fracture ratio is greater than or equal to 0.45 and less than or equal to 0.8, the particle size distribution coefficient of the core bridging particle is greater than 1.4, and the particle size distribution coefficient of the secondary bridging particle is greater than 0.8; and when the fracture width condition is 3 mm×1.5 mm, the particle size distribution rule includes that particle fracture ratio is greater than or equal to 0.45 and less than or equal to 0.8, the particle size distribution coefficient of the core bridging particle is greater than or equal to 1.6, and the particle size distribution coefficient of the secondary bridging particle is greater than or equal to 1.

5. A fluid loss plugging simulation experimental method, comprising:
   setting a plurality of experimental schemes for fluid loss plugging;
   optimizing a particle size distribution of a lost circulation material using the method of claim 1;
   setting particle sizes of the lost circulation material used in the plurality of experimental schemes for fluid loss plugging; and
   conducting fluid loss plugging simulation experiments using a visual experimental device based on the plurality of experimental schemes to obtain experimental results of the plurality of experimental schemes.

6. The method of claim 5, wherein the visual experimental device includes a temperature and pressure regulation device, a wellbore simulation device, a visual fracture plate device, and a leakage fluid collection device connected in sequence, wherein the temperature and pressure regulation device is configured to regulate temperature and pressure of the wellbore simulation device, and a fracture inlet and a fracture outlet of the visual fracture plate device is provided with a notch, respectively.

7. The method of claim 6, wherein the visual experimental device further includes a camera device, and the camera device is configured to capture an image of a process of the lost circulation material forming a plugging zone and pressure bearing and plugging of the plugging zone.

8. The method of claim 7, further comprising:
   analyzing a force feature of a pressure destabilization process of the plugging zone using a digital image correlation method.

* * * * *